(12) United States Patent
Ishimaru et al.

(10) Patent No.: US 9,831,145 B2
(45) Date of Patent: Nov. 28, 2017

(54) SEMICONDUCTOR DEVICE, AND ALTERNATOR AND POWER CONVERTER USING THE SEMICONDUCTOR DEVICE

(71) Applicant: Hitachi Power Semiconductor Device, Ltd., Hitachi-shi, Ibaraki (JP)

(72) Inventors: Tetsuya Ishimaru, Tokyo (JP); Mutsuhiro Mori, Tokyo (JP); Shinichi Kurita, Hitachi (JP); Shigeru Sugayama, Hitachi (JP); Junichi Sakano, Tokyo (JP); Kohhei Onda, Tokyo (JP)

(73) Assignee: Hitachi Power Semiconductor Device, Ltd., Hitachi-shi (JP)

( * ) Notice: Subject to any disclaimer, the term of this patent is extended or adjusted under 35 U.S.C. 154(b) by 0 days.

(21) Appl. No.: 15/509,882

(22) PCT Filed: Aug. 19, 2015

(86) PCT No.: PCT/JP2015/073182
§ 371 (c)(1),
(2) Date: Mar. 9, 2017

(87) PCT Pub. No.: WO2016/039094
PCT Pub. Date: Mar. 17, 2016

(65) Prior Publication Data
US 2017/0263516 A1    Sep. 14, 2017

(30) Foreign Application Priority Data

Sep. 11, 2014 (JP) ................................. 2014-184783

(51) Int. Cl.
*H01L 23/495* (2006.01)
*H01L 23/31* (2006.01)
(Continued)

(52) U.S. Cl.
CPC ............ *H01L 23/13* (2013.01); *H01L 23/142* (2013.01); *H01L 23/3142* (2013.01); *H01L 25/16* (2013.01); *H01L 25/18* (2013.01)

(58) Field of Classification Search
CPC ..... H01L 2924/12035; H01L 23/49838; H01L 25/16; H01L 23/142; H01L 23/3142; H01L 2224/33181; H01L 23/3675
See application file for complete search history.

(56) References Cited

U.S. PATENT DOCUMENTS 5,726,557 A    3/1998 Umeda et al.
5,886,403 A    3/1999 Yoshinaga et al.
(Continued)

FOREIGN PATENT DOCUMENTS

JP    8-336238 A    12/1996
JP    10-215552 A    8/1998
(Continued)

OTHER PUBLICATIONS

International Search Report (PCT/ISA/210) issued in PCT Application No. PCT/JP2015/073182 dated Nov. 17, 2015 with English-language translation (five (5) pages).
(Continued)

*Primary Examiner* — Jasmine Clark
(74) *Attorney, Agent, or Firm* — Crowell & Moring LLP

(57) ABSTRACT

Provided is a semiconductor device including: a first external electrode which includes a circular outer peripheral portion; a MOSFET chip; a control circuit chip which receives voltages of a drain electrode and a source electrode of the MOSFET and supplies a signal to a gate electrode to control the MOSFET on the basis of the voltage; a second external electrode which is disposed on an opposite side of the first external electrode with respect to the MOSFET chip and includes an external terminal on a center axis of the
(Continued)

circular outer peripheral portion of the first external electrode; and an isolation substrate which isolates the control circuit chip from the external electrode. The first external electrode, the drain electrode and the source electrode of the MOSFET chip, and the second external electrode are disposed to be overlapped in a direction of the center axis. The drain electrode of the MOSFET chip and the first external electrode are connected. The source electrode of the MOSFET chip and the second external electrode are connected.

17 Claims, 17 Drawing Sheets

(51) Int. Cl.
*H02K 11/04* (2016.01)
*H01L 23/13* (2006.01)
*H01L 25/18* (2006.01)
*H01L 25/16* (2006.01)
*H01L 23/14* (2006.01)

(56) References Cited

U.S. PATENT DOCUMENTS

| | | | | |
|---|---|---|---|---|
| 6,160,309 | A * | 12/2000 | Le | H01L 23/051 257/684 |
| 6,958,530 | B1 * | 10/2005 | Huang | H01L 23/13 257/684 |
| 7,009,223 | B1 * | 3/2006 | Huang | H01L 23/24 257/177 |
| 7,030,476 | B2 * | 4/2006 | Park | H01L 23/049 257/658 |
| 8,350,378 | B2 * | 1/2013 | Spitz | H01L 23/049 257/678 |
| 2002/0141214 | A1 | 10/2002 | Grover | |
| 2002/0163322 | A1 | 11/2002 | Saxelby et al. | |
| 2005/0280490 | A1 | 12/2005 | Uchiyama et al. | |
| 2006/0220218 | A1 * | 10/2006 | Sheen | H01L 23/051 257/697 |
| 2010/0091533 | A1 | 4/2010 | Masson et al. | |
| 2010/0244559 | A1 | 9/2010 | Goerlach et al. | |

FOREIGN PATENT DOCUMENTS

| | | |
|---|---|---|
| JP | 2001-251861 A | 9/2001 |
| JP | 2003-33038 A | 1/2003 |
| JP | 2004-519991 A | 7/2004 |
| JP | 2006-165499 A | 6/2006 |
| JP | 2009-194791 A | 8/2009 |
| JP | 2010-258135 A | 11/2010 |
| JP | 2011-507468 A | 3/2011 |
| JP | 2012-142466 A | 7/2012 |

OTHER PUBLICATIONS

Japanese-language Written Opinion (PCT/ISA/237) issued in PCT Application No. PCT/JP2015/073182 dated Nov. 17, 2015 (four (4) pages).

* cited by examiner

SEMICONDUCTOR DEVICE, AND ALTERNATOR AND POWER CONVERTER USING THE SEMICONDUCTOR DEVICE

TECHNICAL FIELD

The present invention relates to a semiconductor device which performs rectification, an alternator and a power conversion device which use the semiconductor device.

BACKGROUND ART

Conventionally, an automobile is mounted with an alternator which generates electric power from dynamic power. The alternator rectifies the generated AC power into DC power to charge a battery with the obtained power. A diode is generally used as a rectifier.

In PTL 1, the diode is used as the rectifier. A terminal of the upper surface of the diode chip is connected to a lead electrode, and a terminal of the lower surface of the diode chip is connected to a base electrode. Then, there is disclosed a technique in which a package made of the base electrode is fixed to an electrode plate of the alternator through a solder or by press-fitting. In recent years, a MOSFET (Metal Oxide Semiconductor Field Effect Transistor) is used as the rectifier of the alternator. PTLs 2 and 3 disclose techniques of the rectifier which employs the MOSFET used in the alternator.

CITATION LIST

Patent Literature

PTL 1: JP 10-215552 A
PTL 2: JP 2003-33038 A
PTL 3: JP 2011-507468 A

SUMMARY OF INVENTION

Technical Problem

However, as disclosed in PTL 1, in the technique of using the diode as the rectifier, a built-in potential (a difference of work functions of a P-type semiconductor and an N-type semiconductor) caused by a PN junction is applied to the diode, and thus a voltage drop occurs even in a forward direction, so that voltage loss and power loss are increased.

In addition, the problem of the built-in potential in PTLs 2 and 3 is avoided using the MOSFET. However, the square MOSFET (square shape) is built in a package, and there is no compatibility with the package which uses the conventional diode. In addition, when the package of the square MOSFET is used, there is a need to match positions in a direction around a rotation axis of the package (rectifier) of the MOSFET so that the rectifier is fixed to a hole provided in the alternator by press-in when the rectifier is fixed to the alternator. Therefore, it is difficult to easily fix a large quantity of rectifiers to the alternator. In particular, in a case where the fixation is performed by press-fitting which is a mainstream in recent years, there is a need to accurately perform the positioning in a direction around the rotation axis with respect to the square package, and thus the fixation becomes difficult.

A specific alternator has to be prepared to press-fit and fix the package of the square MOSFET, and a development cost and a manufacturing cost are increased while the versatility is reduced.

In other words, since the shapes of both rectifiers are different, the alternator using the rectifier of the diode and the alternator using the rectifier using the package of the square MOSFET have to be separately developed and manufactured. In addition, it is not possible to use an assembling apparatus which press-fits and fixes the rectifier of the diode to the alternator, and a separate apparatus has to be prepared and used to fix the package of the square MOSFET to the alternator.

The invention has been made in view of the above problems, and an object thereof is to provide a semiconductor device, an alternator using the semiconductor device, and a power conversion device which has less voltage loss and less power loss, and an assembling process is simple so that the rectification can be performed at a low manufacturing cost.

Solution to Problem

The following configuration is provided to achieve the object of the invention while solving the problems.

That is, a semiconductor device according to the invention includes: a first external electrode that includes a circular outer peripheral portion in one surface; a MOSFET chip that includes a drain electrode, a source electrode, and a gate electrode; a control circuit chip that receives voltages or currents of the drain electrode and the source electrode of the MOSFET chip, and supplies a signal to the gate electrode of the MOSFET chip to control the MOSFET chip on the basis of the voltages or the currents; a second external electrode that is disposed on an opposite side of the first external electrode with respect to the MOSFET chip, and includes an external terminal on a center axis of the circular outer peripheral portion of the first external electrode; and an isolation substrate that electrically isolates the control circuit chip from the first external electrode or the second external electrode, wherein the first external electrode, the drain electrode and the source electrode of the MOSFET chip, and the second external electrode are disposed to be overlapped in a direction of the center axis, wherein one of the drain electrode and the source electrode of the MOSFET chip is electrically connected to the first external electrode, and wherein the other one of the drain electrode and the source electrode of the MOSFET chip is electrically connected to the second external electrode.

In addition, other solutions will be given in the description of embodiments.

Advantageous Effects of Invention

According to the invention, it is possible to provide a semiconductor device, an alternator and a power conversion device using the semiconductor device, which can be simply assembled, and voltage loss and power loss are low.

DESCRIPTION OF EMBODIMENTS

Hereinafter, modes (referred to as "embodiments" in the following) for carrying out the invention will be described with reference to the drawings.

<<First Embodiment: Semiconductor Device and Rectifier S1>>

The description will be given about a semiconductor device of a first embodiment of the invention. The semiconductor device of the first embodiment is configured to form a rectifier using MOSFETs, and will be appropriately referred to as "rectifier S1".

<Configuration (Structure) of Rectifier S1>

The configuration (structure) of the rectifier (semiconductor device) S1 will be described with reference to FIGS. 1 to 4. Further, there are two configurations (structures) called "forward side" and "reverse side" in the configuration (structure) of the rectifier S1. A difference between "forward side" and "reverse side" is distinguished by a difference in electric polarity and a difference of the corresponding configuration (structure).

Figure 1:
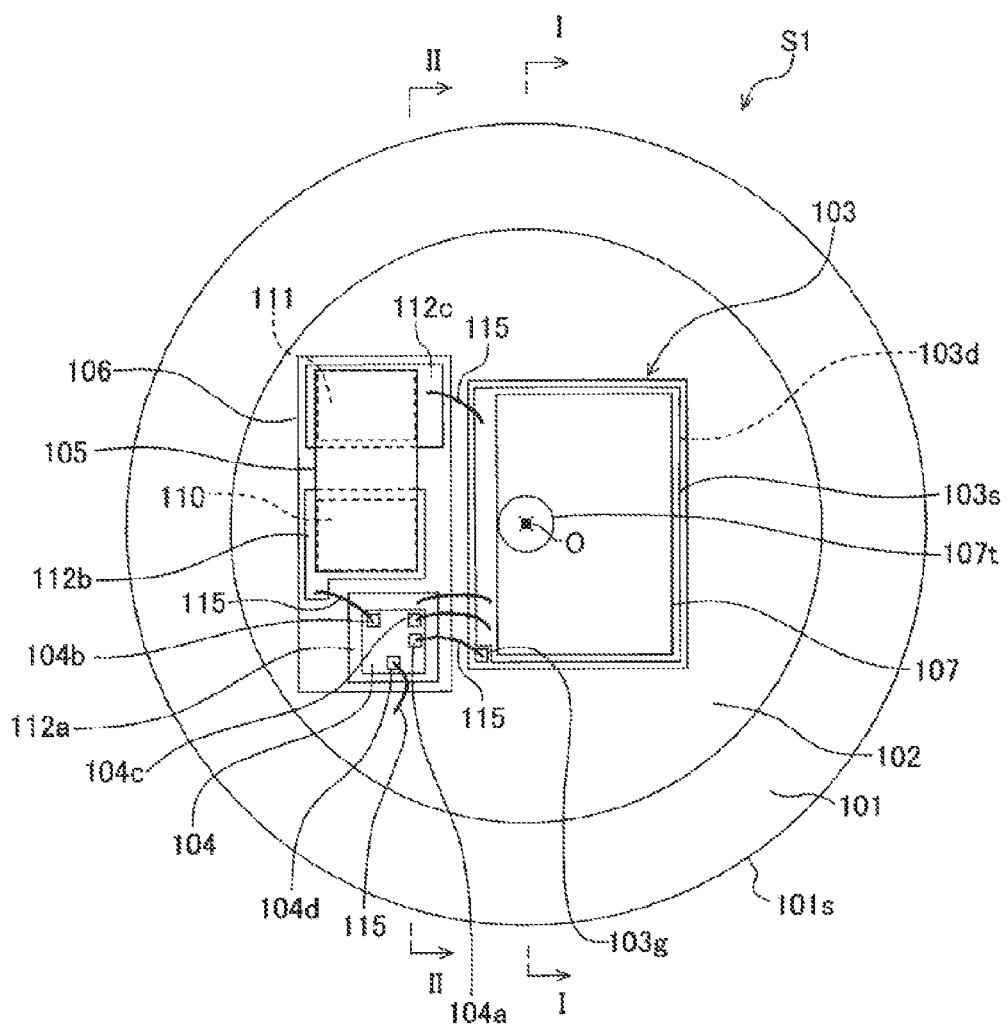
FIG. 1 is a top view illustrating a rectifier S1 of a semiconductor device according to a first embodiment of the invention when viewed from above in which a lead terminal faces upward and a base electrode faces downward.
Figure 2:
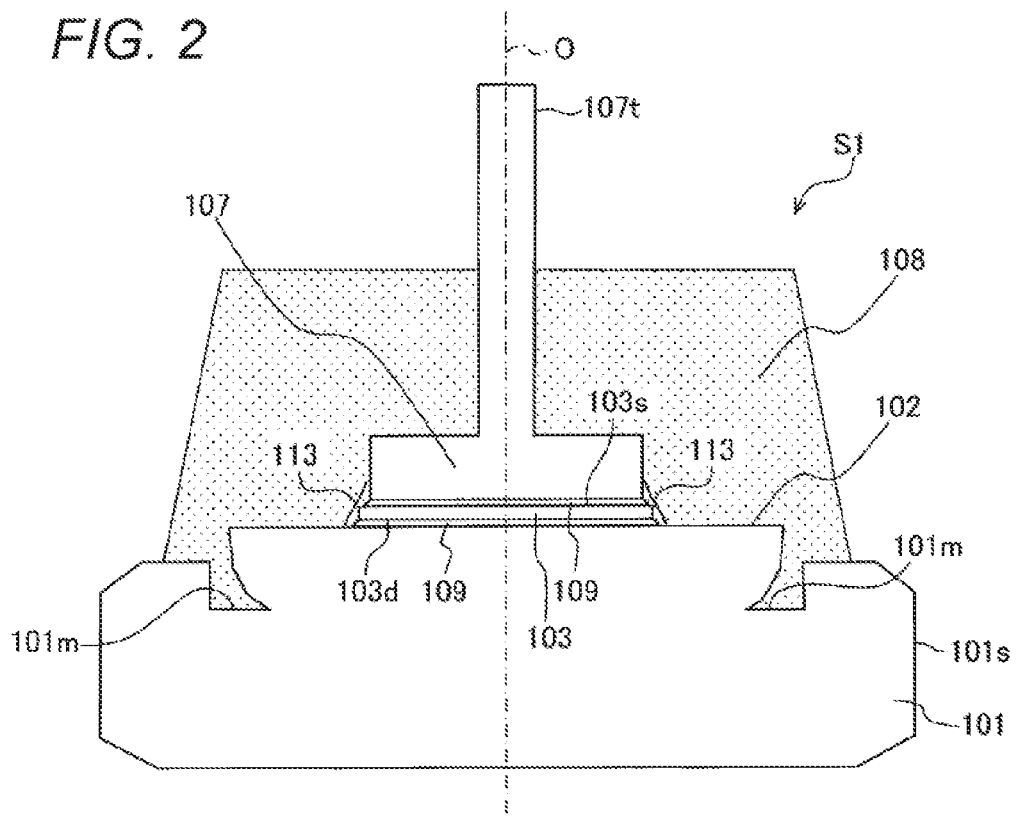
FIG. 2 is a cross-sectional view taken along a ling I-I of FIG. 1.
Figure 3:
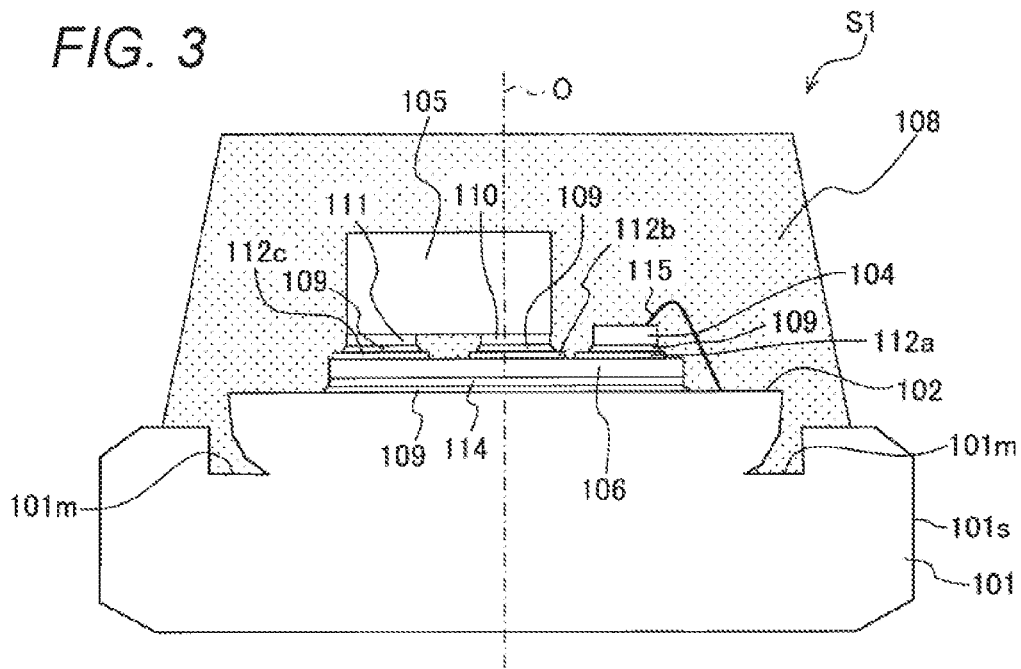
FIG. 3 is a cross-sectional view taken along a line II-II of FIG. 1.

The configuration (structure) of the rectifier S1 illustrated in FIGS. 1 to 3 is a configuration called "forward side". Further, the configuration (structure) of a rectifier (semiconductor device) S2 of "reverse side" will be described later with reference to FIGS. 15 to 17.

FIG. 1 is a top view illustrating the rectifier S1 when viewed from above in which a lead terminal 107t (an external terminal, and part of a second external electrode) faces upward and a base electrode 101 (first external electrode) faces downward. Further, part of a package covering the rectifier S1 and a resin 108 (see FIG. 2) are omitted in order to help with explanation in FIG. 1.

In addition, FIG. 2 is a cross-sectional view taken along a line I-I of FIG. 1, and is a diagram when viewed from the left side in the sheet of FIG. 1.

In addition, FIG. 3 is a cross-sectional view taken along a line II-II of FIG. 1, and is a diagram when viewed from the left side in the sheet of FIG. 1.

Figure 4:
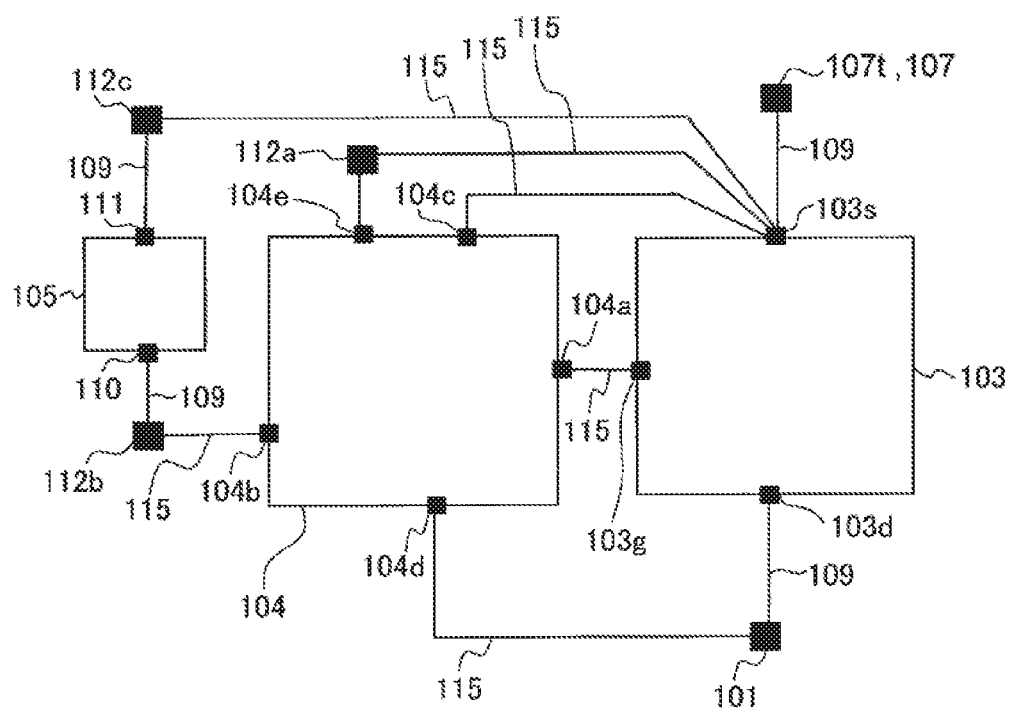
FIG. 4 is a diagram illustrating a relation of electrical connection among the components of the rectifier S1 of the semiconductor device according to the first embodiment of the invention.

In addition, FIG. 4 is a diagram illustrating a relation of electric connection among the components of the rectifier S1 illustrated in FIGS. 1 to 3.

In FIG. 1, the rectifier S1 includes the base electrode 101 having a circular outer peripheral portion 101s in top view, and a pedestal 102 provided in the upper portion of the base electrode 101.

In addition, as illustrated in FIGS. 1 and 2, a MOSFET chip 103 made of a MOSFET and an isolation substrate 106 are mounted on the pedestal 102.

Further, the base electrode 101 and the pedestal 102 are made of the same material and integrally formed. In the base electrode 101, a portion serving to build the MOSFET chip 103 and the isolation substrate 106 is called the pedestal 102. A groove 101m (see FIG. 2) is formed between the surroundings of the pedestal 102 and the base electrode 101.

In addition, a lead electrode 107 (second external electrode) and the lead terminal 107t which is part of the lead electrode 107 and serves as a terminal are provided on the MOSFET chip 103. The lead electrode 107 and the lead terminal 107t are substantially at the same potential.

A center axis O of the package as the rectifier S1 is placed at the center of the base electrode 101. In addition, the center of the shaft of the lead terminal 107t is matched with the center axis O.

The MOSFET chip 103 includes a gate electrode 103g, a source electrode 103s, and a drain electrode 103d as a MOSFET.

The source electrode 103s and the drain electrode 103d are overlapped in top view, and can be seen from the source electrode 103s in relation that the source electrode 103s is placed above and the drain electrode 103d is placed below, but the drain electrode 103d is not able to be seen. Therefore, a lead wire of the source electrode 103s is depicted by a solid line, and a lead wire of the drain electrode 103d is depicted by a broken line (see FIGS. 1 and 2).

Further, the MOSFET chip 103 illustrated in FIGS. 1 and 3 is formed such that the source and the drain are configured in a vertical structure. The MOSFET may be a planar type or a trench type as long as the MOSFET has the vertical structure.

In addition, the MOSFET includes an n-type MOSFET (both the source and the drain are made of an n-type semiconductor) having an n-type channel and a p-type MOSFET (both the source and the drain are made of a p-type semiconductor) of a p-type channel. The n-type MOSFET (the carrier is electrons) having a large mobility of the carrier is assumed in FIGS. 1 and 3.

In addition, as illustrated in FIGS. 1 and 3, the isolation substrate 106 is fixed to the pedestal 102 of the base electrode 101 using a solder 109 through an electrode 114 provided on the rear surface of the 106.

Further, the solder 109 provided on the electrode 114 and the pedestal 102 is used to fix the isolation substrate 106 to the pedestal 102, but does not mean an electrical connection.

An electrode 112a is provided on the isolation substrate 106, and a control circuit chip 104 is mounted on the electrode 112a.

The control circuit chip 104 includes a first electrode 104a, a second electrode 104b, a third electrode 104c, and a fourth electrode 104d.

In addition, electrodes 112b and 112c are provided on the isolation substrate 106, and a capacitor 105 is mounted on the electrodes 112b and 112c. A high voltage side terminal 110 of the capacitor 105 is placed on the electrode 112b, and a low voltage side terminal 111 is placed on the electrode 112c.

Further, the pedestal 102, the MOSFET chip 103, the control circuit chip 104, the capacitor 105, and the isolation substrate 106 is covered by the resin (first resin) 108 (see FIGS. 2 and 3). The details of the resin (first resin) 108 and a JCR (second resin) 113 (FIG. 2) will be described below.

In addition, the MOSFET chip 103, the control circuit chip 104, and the capacitor 105 are components used to form a circuit as the rectifier S1 of FIG. 5 as described below.

In addition, the respective elements (the MOSFET chip 103, the control circuit chip 104, and the capacitor 105) are electrically connected by a plurality of wires 115. The details of the connection will be described below.

As illustrated in FIG. 1, the MOSFET chip 103 and the rectangular isolation substrate 106 which is formed in a square (rectangular) shape in top view and built with the rectangular capacitor 105 and the rectangular control circuit chip 104 are disposed such that the long sides are adjacent to each other in parallel.

With such an arrangement, the MOSFET chip 103, the capacitor 105, and the control circuit chip 104 can be disposed adjacently to each other, and a space therebetween can be made narrow. Therefore, the MOSFET chip 103, the capacitor 105, and the control circuit chip 104 can be disposed with a large mounting efficiency.

In addition, a distance necessary for electrically connecting the first to fourth electrodes 104a to 104d of the control circuit chip 104, the MOSFET chip 103, and the capacitor 105 becomes shortest.

With such a shape and an arrangement, the length of the wire 115 electrically connecting the control circuit chip 104, the MOSFET chip 103, and the capacitor 105 can be made shortest, and the electrical connection is increased in reliability. In addition, an inductance of the wiring becomes small, and thus noise resistance can be increased. Furthermore, the wire 115 can be made with a small amount, an assembly performance is improved, and the cost is suppressed.

<Connection of MOSFET chip 103>

Next, the connection of the MOSFET chip 103 will be described with reference to FIGS. 1, 2, and 4.

In FIGS. 1 and 2, the drain electrode 103d provided in the lower surface of the MOSFET chip 103 is fixed to the pedestal 102 of the base electrode 101 using the solder 109. With such a structure, the MOSFET chip 103 is electrically and thermally connected to the base electrode 101.

In other words, an extending surface of the drain electrode 103d of the MOSFET chip 103 is connected and fixed to the upper surface (extending surface) of the pedestal 102 of the base electrode 101 through the solder 109. Therefore, the expression "thermally connected to the base electrode 101" means that a heating surface area of the MOSFET chip 103 and the base electrode 101 becomes wide and a heating distance becomes short, and thus the heat of the MOSFET chip 103 is efficiently transferred and discharged to the base electrode 101.

The source electrode 103s provided in the upper surface of the MOSFET chip 103 is fixed to the lead electrode 107 using the solder 109. Therefore, the MOSFET chip 103 is electrically and thermally connected to the lead electrode 107. In other words, the extending surface of the source electrode 103s of the MOSFET chip 103 is connected and fixed to the lower surface (extending surface) of the lead electrode 107 through the solder 109. Therefore, the expression "thermally" means that the heating surface area of the MOSFET chip 103 and the source electrode 103s becomes wide and the heating distance becomes short, and thus the heat of the MOSFET chip 103 is efficiently transferred to the source electrode 103s and discharged through the lead electrode 107 (the lead terminal 107t).

As illustrated in FIGS. 1, 2, and 4, the gate electrode 103g of the upper surface of the MOSFET chip 103 is electrically connected to the first electrode 104a which is provided in the upper surface of the control circuit chip 104 by wire bonding using the wire 115.

In this way, as described above, the distance between the gate electrode 103g of the MOSFET chip 103 and the first electrode 104a of the control circuit chip 104 becomes the shortest, and the length of the wire 115 becomes the shortest by disposing the gate electrode 103g of the MOSFET chip 103 at the corner near the control circuit chip 104 of the MOSFET chip 103.

With such an arrangement, the wire bonding by the wire 115 is secured, and the connection is increased in reliability. In addition, an inductance of the wiring becomes small, and thus noise resistance is increased.

<Connection of Capacitor 105>

Next, the connection of the capacitor 105 will be described.

As illustrated in FIGS. 1 and 3, the high voltage side terminal 110 of the capacitor 105 is electrically connected to the electrode 112b which is provided in the upper surface of the isolation substrate 106 using the solder 109.

The low voltage side terminal 111 of the capacitor 105 is electrically connected to the electrode 112c which is provided in the upper surface of the isolation substrate 106 using the solder 109.

The electrode 112b on the isolation substrate 106 connected to the high voltage side terminal 110 of the capacitor 105 is connected to the second electrode 104b provided in the upper surface of the control circuit chip 104 by the wire bonding using the wire 115.

The electrode 112c on the isolation substrate 106 connected to the low voltage side terminal 111 of the capacitor 105 is connected to the source electrode 103s of the MOSFET chip 103 by the wire bonding using the wire 115.

Further, as described above, the low voltage side terminal 111 of the capacitor 105 is connected to the electrode 112c and the source electrode 103s of the MOSFET chip 103 using the solder 109 and the wire 115, and thus also electrically connected to the lead electrode 107 (the lead terminal 107t) (see FIG. 4).

Further, in place of the wire bonding, the electrode 112c and the source electrode 103s of the MOSFET chip 103 may be electrically connected such that the third electrode 112c provided in the upper surface of the isolation substrate 106 is electrically connected using the third electrode 104c and the wire provided in the upper surface of the control circuit chip 104, or may be electrically connected by the wire bonding using the electrode 112a and the wire provided on the isolation substrate 106 or by the electrode on the isolation substrate. The low voltage side terminal 111 of the capacitor 105 can be electrically connected to the lead electrode 107 by any connection method.

<Connection of Control Circuit Chip 104>

Next, the connection of the control circuit chip 104 will be described. As illustrated in FIGS. 1, 3, and 4, the first electrode 104a provided in the upper surface of the control circuit chip 104 is electrically connected to the gate electrode 103g provided in the upper surface of the MOSFET chip 103 by the wire bonding using the wire 115. In addition, the second electrode 104b provided in the upper surface of the control circuit chip 104 is electrically connected to the first electrode 112b of the upper surface of the isolation substrate 106 connected to the high voltage side terminal 110 of the capacitor 105 by the wire bonding using the wire 115.

In addition, the third electrode 104c provided in the upper surface of the control circuit chip 104 uses the wire 115 for the electrical connection to the source electrode 103s forming the upper surface of the MOSFET chip 103.

In addition, the fourth electrode 104d provided in the upper surface of the control circuit chip 104 is electrically connected to the pedestal 102 of the base electrode 101 by the wire bonding using the wire 115.

In addition, the electrode 112a provided on the isolation substrate 106 connected to the rear surface of the control circuit chip 104 using the solder 109 is electrically connected to the source electrode 103s forming the upper surface of the MOSFET chip 103 by the wire bonding using the wire 115.

Further, the wire bonding to the source electrode 103s is not required if the third electrode 104c provided in the upper surface of the control circuit chip 104 is electrically connected to the rear surface of the control circuit chip 104 in the control circuit chip 104. When the wire is not used, the electrical connection can be increased in reliability. In addition, the connection in the control circuit chip 104 described above is a connection in a case where an IC in which elements are formed in an SOI (silicon on insulator) wafer, or an IC in which elements are formed separately from each other by a PN junction in a P-type silicon wafer is used as the control circuit chip 104. In the case of using the IC in which the elements are formed in an N-type silicon wafer while being separated from each other by the PN junction, the rear surface of the control circuit chip 104 is connected to have the same potential as that of the base electrode. In other words, the electrode 112a on the isolation substrate 106 on which the control circuit chip 104 is built is electrically connected to the pedestal 102 of the base electrode 101 by the wire bonding using the wire. Alternatively, the control circuit chip 104 is placed on the pedestal 102 of the base electrode 101, and the rear surface of the control circuit chip 104 is electrically connected to the pedestal 102 of the base electrode 101 using the solder.

<Arrangement and Connection of Capacitor, Control Circuit Chip, and MOSFET Chip>

In the electrical connection between the capacitor 105 and the control circuit chip 104, as illustrated in FIGS. 1 and 4, the high voltage side terminal 110 of the capacitor 105 and the second electrode 104b of the control circuit chip 104 are disposed such that the high voltage side terminal 110 of the capacitor 105 is connected to the second electrode 104b of the control circuit chip 104 by the shortest distance through the wire 115. With such an arrangement and a connection, the mounting efficiency of the control circuit chip 104 and the capacitor 105 is increased, and the wire bonding is improved in reliability. In addition, an inductance of the wiring becomes small, and thus noise resistance is increased.

In addition, with the connection by the wire 115 described above, the electrical connection between the MOSFET chip 103 and the control circuit chip 104 and the electrical connection between the control circuit chip 104 and the capacitor 105 are made. In addition, the control circuit chip 104, the capacitor 105, and the base electrode 101 are electrically connected. With the above configuration, a forward side rectifier S1 can be realized.

<Circuit Configuration of Rectifier S1>

Subsequently, a circuit configuration of the rectifier S1 will be described. FIG. 5 is a circuit diagram illustrating the circuit configuration of the rectifier (semiconductor device) S1 according to the first embodiment of the invention.

In the circuit diagram illustrated in FIG. 5, the MOSFET chip 103, the control circuit chip 104, and the capacitor 105 described with reference to FIGS. 1 to 4 are electrically connected and wired between an H terminal and an L terminal as described above.

The MOSFET chip 103 includes a diode 103i as a parasitic diode which is built in reverse parallel with an n-channel (n-type) MOSFET (synchronous rectification MOSFET) 103mn.

The control circuit chip 104 is configured to include a comparator 116 which compares the voltage at the L terminal and the voltage at the H terminal, a gate driver 117 which applies a voltage to the gate electrode 103g of the MOSFET 103mn, and a diode 118 for preventing the reverse flow.

A first input terminal (inverting input terminal) 116i1 which is one input of the comparator 116 is connected to the H terminal, and a second input terminal (non-inverting input terminal) 116i2 which is the other input of the comparator 116 is connected to the L terminal.

An output terminal 116o of the comparator 116 is connected to an input terminal 117i of the gate driver 117.

An output terminal 117o of the gate driver 117 is connected to the gate electrode 103g of the MOSFET chip 103 (the MOSFET 103mn).

In addition, the high voltage side terminal 110 of the capacitor 105 is connected to a power terminal 116v of the comparator 116 and a power terminal 117v of the gate driver 117. In addition, the low voltage side terminal 111 of the capacitor 105 is connected to the L terminal. The anode of the diode 118 for preventing the reverse flow is connected to the H terminal. The cathode of the diode 118 is connected to the power terminal 117v of the gate driver 117, the power terminal 116v of the comparator 116, and the high voltage side terminal 110 of the capacitor 105 as described above.

<Operation of Circuit of Rectifier S1>

The operation of the circuit of the rectifier S1 illustrated in FIG. 5 will be described sequentially.

When the voltage at the H terminal becomes lower than the voltage at the L terminal, the comparator 116 outputs a high voltage signal to the gate driver 117.

The gate driver 117 to which the high voltage signal is input raises the voltage of the gate electrode 103g of the MOSFET chip 103 (the MOSFET 103mn) to turn on the MOSFET chip 103.

On the contrary, when the voltage at the H terminal becomes higher than that at the L terminal, the comparator 116 outputs a low voltage signal to the gate driver 117.

The gate driver 117 to which the low voltage signal is input lowers the voltage of the gate electrode 103g of the MOSFET chip 103 (the MOSFET 103mn) to turn off the MOSFET chip 103.

In other words, the comparator 116 compares the voltages at the H terminal and the L terminal, and turns on/off the MOSFET chip 103 by the gate driver 117.

The capacitor 105 supplies a power voltage to the comparator 116 and the gate driver 117 using the accumulated charges through the power terminals 116v and 117v, respectively.

Figure 5:
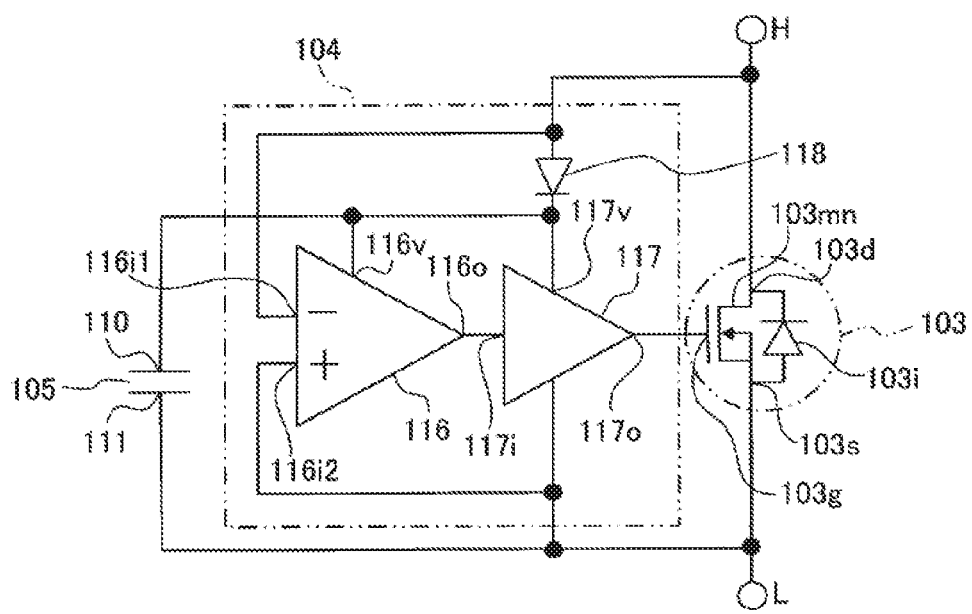
FIG. 5 is a circuit diagram illustrating a circuit configuration of the rectifier S1 of the semiconductor device according to the first embodiment of the invention.

Further, the circuit illustrated in FIG. 5 is given as an example of the control circuit for realizing the rectifier S1 of the invention, but the invention is not limited thereto. In place of the comparator 116, a differential amplifier may be used to detect and amplify the input signal, or the turning on/off may be controlled using the direction of the current flowing to the MOSFET chip 103.

In addition, in place of the capacitor 105 illustrated in FIG. 5, the power may be supplied from the outside.

<Other Configuration and Structure of Rectifier S1>

Next, the configuration and structure of the rectifier S1 will be supplemented or described in detail.

[Shape and Arrangement of MOSFET Chip]

In FIG. 1, the MOSFET chip 103 is a square (quadrangle) in top view, and preferably a rectangle rather than the square. The capacitor 105 and the control circuit chip 104 are disposed at positions near the long side of the rectangle.

With such a shape and an arrangement, the components (103, 104, and 105) can be built in the pedestal 102 with good area efficiency, and a larger dimension of the MOSFET chip 103 and the capacitor 105 can be used.

As illustrated in FIG. 1, the position of the gate electrode 103g of the MOSFET chip 103 is placed at the nearest corner or side toward the first electrode 104a of the control circuit chip 104 of the upper surface of the MOSFET chip 103.

With such an arrangement, the length of the wire 115 electrically connecting the MOSFET chip 103 to the first electrode 104a of the control circuit chip 104 can be shortened, and the reliability can be improved against a heat fatigue in a thermal fatigue test of the wiring or the temperature degradation in a temperature cycling test.

In addition, the MOSFET chip 103 is placed on the center axis O (rotation axis) of the base electrode 101 and the pedestal 102 in top view.

[Arrangement on Center Axis of the Package of Lead Terminal]

As described above, the MOSFET chip 103 is placed on the center axis O (rotation axis) of the base electrode 101 and the pedestal 102 in top view, and the terminal of the lead electrode 107 (see FIG. 2) connected to the upper surface of the MOSFET chip 103 is also placed on the center axis O of the base electrode 101 and the pedestal 102.

With such an arrangement and a configuration, the lead terminal 107t (the lead electrode 107) can be connected to an alternator which uses a rectifier equipped with the conventional diode by using the rectifier S1 equipped with the MOSFET of the invention.

In addition, since the terminal of the lead electrode 107 is placed on the center axis O of the package of the rectifier S1 in top view, symmetry of the lead electrode 107 in the package can be achieved, and resistance (rigidity) against a bending force applied to the lead electrode 107 can be improved.

Furthermore, since the terminal (the lead terminal 107t) of the lead electrode 107 is placed on the center axis O of the package of the rectifier S1 in top view, there is no need to positional adjustment around the rotation axis (the center axis O) in top view of the MOSFET chip 103. In other words, the rectifier S1 can be positioned by centering the package of the rectifier S1.

[Solder Connection and Heat Radiation of MOSFET]

The electrical connection of the source electrode 103s of the MOSFET chip 103 or the drain electrode 103d is made, as described above, by connecting the lead electrode 107 (the extending surface) and the base electrode 101 (the extending surface, the pedestal 102) to both surfaces of the electrodes (103s and 103d) using the solder 109 without wire. With such a connection, the heat generated in the MOSFET chip 103 at the time of rectifying can be transferred to both the base electrode 101 (the pedestal 102) and the lead electrode 107 with a wide heating surface area through the solder 109, so that the temperature rise of the MOSFET chip 103 can be suppressed.

Since the MOSFET chip 103 has a gate oxide film, the reliability at a high temperature is hardly secured compared to the diode. Furthermore, since the MOSFET chip 103 has a characteristic that the mobility of carriers is reduced as the temperature rises, the On voltage is increased, and a loss is increased unlike the diode.

Therefore, the heat radiation is particularly important in the MOSFET chip 103, and the good heat radiation from the upper and lower surfaces (the source electrode 103s and the drain electrode 103d) of the MOSFET chip 103 is effective for saving power.

Further, the reason that the heat radiation is linked to the saving power is that a resistance component parasitic in the MOSFET chip 103 is reduced, and Joule's heat ($i^2R$) caused by the resistance component is reduced when the temperature of the MOSFET chip 103 is lowered by the good heat radiation.

[Arrangement of Capacitor]

In FIGS. 1 and 3, the capacitor 105 is mounted on the isolation substrate 106 which is built on the pedestal 102 of the base electrode 101, and fixed to the base electrode 101. Then, the capacitor 105 is disposed such that the long side of rectangular the capacitor 105 and the long side of the rectangular MOSFET chip 103 are in parallel.

A direction of the capacitor 105 to be arranged is determined such that the high voltage side terminal 110 of the capacitor 105 is disposed near the control circuit chip 104, and the low voltage side terminal 111 of the capacitor 105 is disposed away from the control circuit chip 104.

With such an arrangement, the area efficiency of the component mounting can be increased. In addition, the length of the wiring can be shortened, and the reliability is improved with respect to the thermal fatigue in the thermal fatigue test or the temperature degradation in the temperature cycling test of the wiring.

[Isolation Material of Isolation Substrate]

An isolating resin, alumina, and aluminum nitride may be used as an isolation material of the isolation substrate 106 illustrated in FIGS. 1 and 3.

Thermal conductivities of these isolation materials are smaller than the thermal conductivity (400 $Wm^{-1}K^{-1}$) of Cu which is a material of the base electrode 101. The isolating resin has a thermal conductivity of 0.3 to 3 $Wm^{-1}K^{-1}$, the alumina 20 to 30 $Wm^{-1}K^{-1}$, and the aluminum nitride about 200 $Wm^{-1}K^{-1}$.

It is possible to suppress the heat generated in the MOSFET chip 103 from being transferred to the capacitor 105 at the time of rectifying by inserting the isolation substrate 106 having a thermal conductivity lower than that of the base electrode 101 between the base electrode 101 and the capacitor 105, and thus it is possible to suppress that the reliability is lowered due to the high temperature of the capacitor 105.

In addition, it is possible to suppress the heat generated in the MOSFET chip 103 from being transferred to the control circuit chip 104 at the time of rectifying by inserting the isolation substrate 106 having a thermal conductivity lower than that of the base electrode 101 between the base electrode 101 and the control circuit chip 104.

An erroneous operation due to a latch-up occurred when the control circuit chip 104 is heated up can be suppressed by suppressing the heating. In addition, it is possible to suppress the reliability of the gate oxide film in the control circuit chip 104 from being lowered.

[Resin 108]

Figure 6:
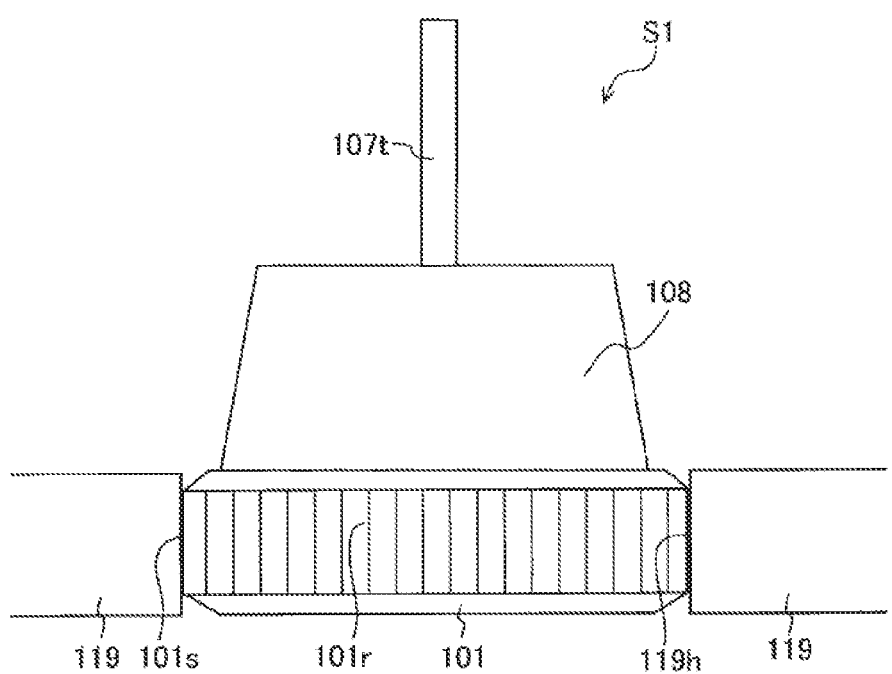
FIG. 6 is a side view of the press-fitting type rectifier S1 which is fixed to a heat dissipation plate of an alternator.

The resin (first resin) 108 illustrated in FIGS. 2, 3, and 6 is formed by a transfer molding method or a potting method to cover the pedestal 102, the components (103, 104, and 105) on the pedestal 102, and the electrodes (103g, 103s, ad 104a to 104d).

The resin 108 can suppress the pedestal 102, the components (103, 104, and 105), and the electrodes (103g, 103s, and 104a to 104d) from being expanded by the temperature rising, and can suppress a defect caused by the heat fatigue in the thermal fatigue test or the temperature degradation in the temperature cycling test caused by a difference in thermal expansion coefficients of the pedestal 102 or the components (103, 104, and 105) on the pedestal 102.

Furthermore, as illustrated in FIG. 2, the groove 101m is formed in the side of the pedestal 102 of the base electrode 101 in order to prevent a defect that the resin 108 is peeled out of the base electrode 101. The groove 101m is desirably formed to be large in top view along near the surface of the pedestal 102 from the lower portion.

With such a shape, the resin 108 goes into the groove 101m of the base electrode 101 to be fixed to the base electrode 101, and it is possible to suppress the resin 108 from being peeled out of the base electrode 101.

[JCR]

Next, the JCR (Junction Coating Resin) illustrated in FIG. 2 will be described. In general, the resin 108 described above is not good at adhesion between the MOSFET chip 103 and the control circuit chip 104.

In other words, the peeling easily occurs, and thus a coating material (second resin) called JCR having a high adhesion to the semiconductor chips (103 and 104) compared to the resin 108 is coated in the side walls of the MOSFET chip 103 and the control circuit chip 104 before forming the resin 108 to form a thin film of the JCR (second resin) 113.

The adhesion between these components (105, 106, and 107) and the resin 108 can be increased by coating the JCR 113 in the capacitor 105, the isolation substrate 106, and the lead electrode 107.

The adhesion of the MOSFET chip 103 and the control circuit chip 104 with respect to the resin 108 can be increased by forming and coating the JCR thin film. It is possible to prevent solder cracks and chip cracks generated during the thermal fatigue test or the temperature cycling test, and to increase the reliability of the rectifier S1.

Further, the groove 101m or/and the JCR may be applied to the rectifier S1 of the embodiment, and rectifiers SIB, S1C, and S2.

[Connection Method of MOSFET Chip]

In the embodiments of FIGS. 1 to 3, the drain electrode 103d of the MOSFET chip 103 and the base electrode 101, and the source electrode 103s of the MOSFET chip 103 and the lead electrode 107 are connected using the solder 109, but may be connected in a press-fitting method. In the press-fitting method, a force of about several kN/cm2 is applied between the base electrode 101 and the lead electrode 107 in a state where the MOSFET chip 103 is interposed therebetween. The drain electrode 103d of the MOSFET chip 103 and the base electrode 101, and the source electrode 103s of the MOSFET chip 103 and the base electrode 101 are electrically and thermally connected without using the solder.

As described above, the extending surface of the drain electrode 103d of the MOSFET chip 103 and the extending surface of the base electrode 101, and the extending surface of the source electrode 103s of the MOSFET chip 103 and the extending surface of the base electrode 101 each are press-fitted and abut so as to be connected with a wide heating surface area. Therefore, the expression "thermally" means that the heat generated in the MOSFET chip 103 can be efficiently transferred to the base electrode 101 and the lead electrode 107.

<Assembly Method of Rectifier S1>

Next, a method of assembling the semiconductor device (the rectifier S1) according to the first embodiment of the invention will be described.

First, the solder paste (109) is coated on the electrodes 112a, 112b, and 112c of the isolation substrate 106, and the control circuit chip 104 and the capacitor 105 are placed thereon and baked in a soldering furnace so as to fix the control circuit chip 104 and the capacitor 105 onto the isolation substrate 106 using the solder 109.

In the assembling, a carbon jig (not illustrated) is used to first fix the components of the rectifier S1 at the predetermined positions. The base electrode 101 is put on the fixing position of the pedestal 102 of the carbon jig, and a lid of the carbon jig is set thereon.

The lid is provided with an opening to insert other components. A solder sheet (109), the MOSFET chip 103, the solder sheet (109), and the lead electrode 107 are overlapped in this order and put into the opening into which the MOSFET is put. In addition, the solder sheet (109), the isolation substrate 106 to which the control circuit chip 104 and the capacitor 105 are fixed are overlapped in this order and put into the opening into which the isolation substrate 106 and the control circuit chip 104 are put into.

Subsequently, the carbon jig into which the component is put is baked in the soldering furnace (not illustrated), and the MOSFET chip 103, the lead electrode 107, the control circuit chip 104, the isolation substrate 106, and the capacitor 105 are fixed onto the pedestal 102 of the base electrode 101 using the solder 109.

Further, the process of fixing the control circuit chip 104 and the capacitor 105 onto the isolation substrate 106, and the process of fixing the MOSFET chip 103, the lead electrode 107, the isolation substrate 106 onto the pedestal 102 of the base electrode 101 may be performed at the same time when one time of the baking is performed using the soldering furnace.

Subsequently, a wire bonding apparatus (not illustrated) is used to connect the assembly components of the rectifier S1 taken out of the carbon jig are connected between the electrodes on the control circuit chip 104 and the MOSFET chip 103, the control circuit chip 104 and the pedestal 102, the control circuit chip 104 and the isolation substrate 106, and the isolation substrate 106 and the pedestal 102 using the wire 115.

Thereafter, the JCR 113 is coated on the side walls of the MOSFET chip 103 and the control circuit chip 104, and the pedestal 102 on the base and the components (103, 104, and 105) on the pedestal are coated using the resin 108 by the transfer molding method or the potting method.

Thereafter, the resin 108 is cured using a cure furnace (not illustrated), and the assembly of the rectifier S1 is completed.

Further, the processing of soldering between the MOSFET chip 103 and the lead electrode 107, and the isolation substrate 106 and the capacitor 105 may be performed after the wire bonding process without a first process of soldering.

<Method of Fixing Rectifier S1 to Heat Dissipation Plate>

Next, the characteristics and the effects of the rectifier S1 described using FIGS. 1 to 5 will be described.

Figure 19:
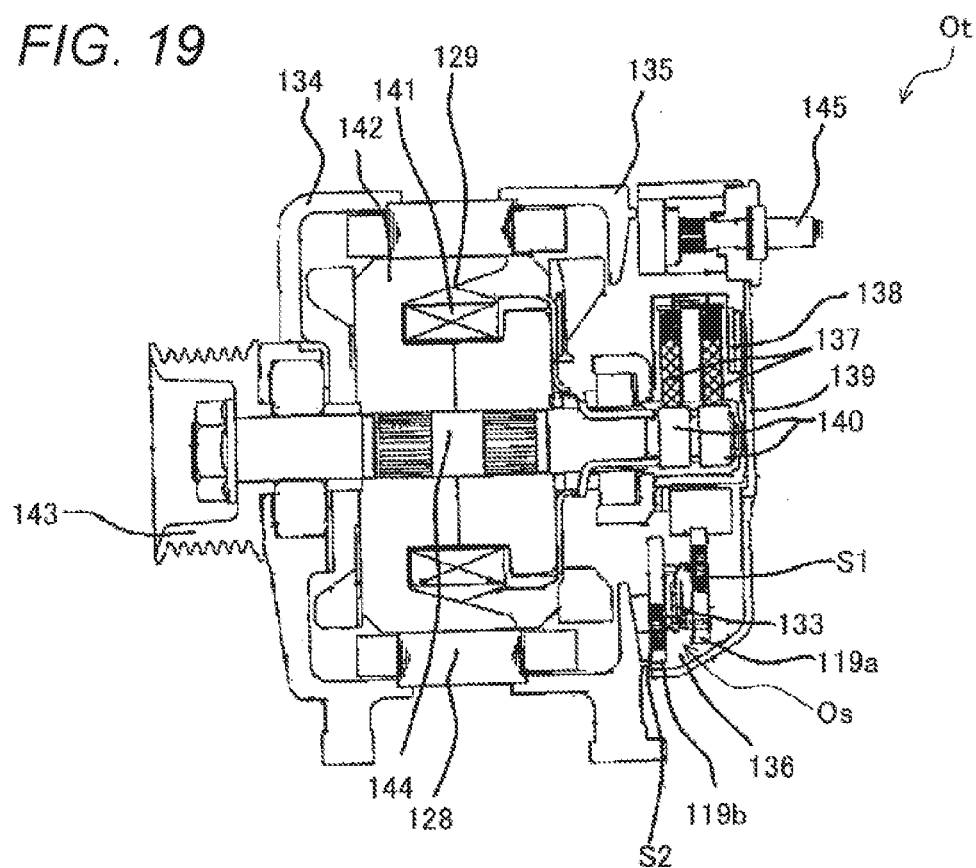
FIG. 19 is a diagram illustrating an outline of configuration and structure of an alternator according to a third embodiment of the invention.

FIG. 6 is a side view of a press-fitting type of rectifier S1 which is fixed to a heat dissipation plate 119 of the alternator (see FIG. 19).

In FIG. 6, the rectifier S1 using the MOSFET chip 103 is fixed to the heat dissipation plate 119 by press-fitting the base electrode 101 into a fitting hole 119h of the heat dissipation plate 119 of the alternator (Ot: FIG. 19).

In a case where the rectifier is fixed by the press-fitting, as illustrated in FIG. 6, a knurling 101r having a concavo-convex shape (irregularities are provided in a radial direction) is formed in the outer peripheral portion 101s of the base electrode 101 in top view.

At the time of the fixing process, the center (the center axis O) of the circular outer peripheral portion 101s of the base electrode 101 of the rectifier S1 is matched with the center of the heat dissipation plate 119 of the alternator the hole 119h by mounting the MOSFET chip 103 in the base electrode 101 containing the circular outer peripheral portion 101s. Therefore, the rectifier S1 using the MOSFET chip 103 can be easily fixed into the fitting hole 119h of the heat dissipation plate 119 of the alternator Ot without positioning in a direction around the rotation axis (the center axis O of the circular outer peripheral portion 101s of the base electrode 101 of FIG. 1) of the package of the rectifier S1.

In other words, the base electrode 101 of the rectifier S1 is press-fitted and fixed to the circular fitting hole 119h smaller than the diameter of the outer peripheral portion 101s of the base electrode 101 provided in the heat dissipation plate 119.

In the case of the press-fitting type of rectifier S1, the positional adjustment in a direction around the rotation axis (the center axis O) is not necessary by matching the center (the center axis O) of the outer peripheral portion 101s of the base electrode 101 to the center of the hole 119h depending on the base electrode 101 containing the circular outer peripheral portion 101s.

In other words, there is no need to perform an accurate positional adjustment between the outer peripheral portion 101s of the base electrode 101 and the fitting hole 119h provided in the heat dissipation plate 119, and the rectifier S1 is simply fixed to the heat dissipation plate 119.

Since there is a need to fit the rectifier S1 of a number of MOSFET chips 103 in the heat dissipation plate 119 of the alternator Ot, the rectifier S1 of the MOSFET chip 103 can be easily fixed to the alternator Ot. Therefore, the manufacturing process of the alternator Ot is simplified, and the cost is reduced.

<Effects of First Embodiment>

With the rectifier S1 which is the semiconductor device using the above MOSFET, it is possible to provide a rectifier having less voltage loss and power loss.

In addition, the external electrode has two terminals, the base electrode (first external terminal) 101 has the circular outer peripheral portion, and a lead terminal (part of the second external terminal) 107 is placed on the circular center axis of the base electrode 101, so that there is compatibility with a diode element which is typically used in the related art.

Therefore, the conventional components and devices can be applied as it is, and thus the manufacturing cost can be suppressed low.

<<Modification of First Embodiment: Semiconductor Device, Rectifier S1B>>

Next, an example where the shape of the pedestal 102 of the rectifier S1 is changed will be described as a modification (the rectifier S1B) of the first embodiment.

Figure 7:
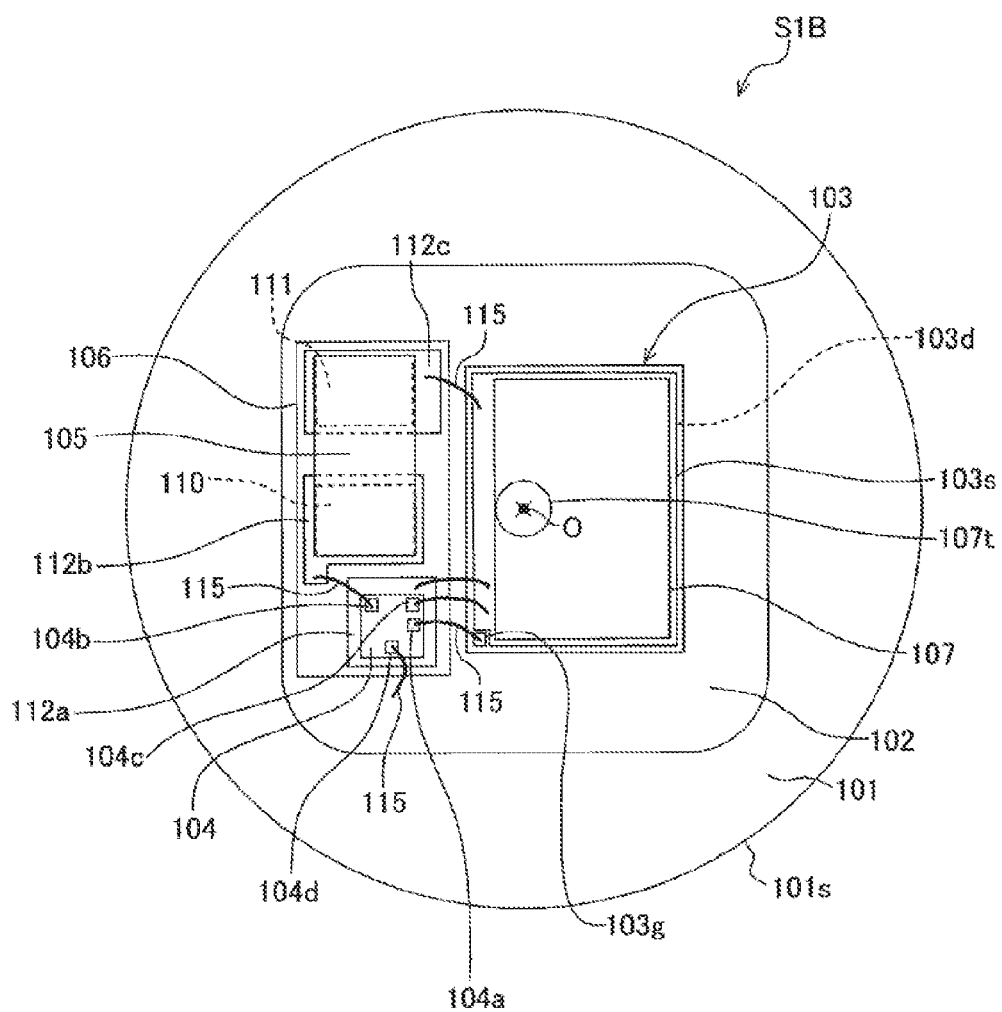
FIG. 7 is a top view illustrating a configuration of a rectifier S1B in a modification example of the semiconductor device according to the first embodiment of the invention.

FIG. 7 is a top view illustrating a configuration of the rectifier S1B in a modification of the semiconductor device (rectifier) according to the first embodiment.

In FIG. 7, the shape of the pedestal 102 is square except the corner portions. The pedestal 102 of the base electrode 101 has been described as a circular shape in the rectifier S1 illustrated in FIG. 1, but may be a square (substantial square) as illustrated in FIG. 7 rather than the circular shape.

In a case where the pedestal 102 is made in a circular shape in top view like the rectifier S1 illustrated in FIG. 1, the end portion of the pedestal surface can be made uniformly, and a thermal fatigue resistance measured in the thermal fatigue test and the reliability of the temperature resistance characteristic measured in the temperature cycling test can be improved.

On the other hand, in a case where the pedestal 102 is made in a square (substantial square) shape in top view like the rectifier S1B of the modification illustrated in FIG. 7, the shape can be disposed along the rectangular shapes of the MOSFET chip 103, the capacitor 105, and the control circuit chip 104, and the components (103, 104, and 105) can be built on the pedestal with good area efficiency.

Therefore, it is possible to build the MOSFET chip 103 and the capacitor 105 having a shape larger than a case where the pedestal 102 is formed in a circular shape in top view.

In addition, even in a case where the pedestal 102 is a square shape, the shape is smoothly changed by setting the curvature of the corner shape of the square pedestal 102 in top view like the rectifier S1B of the modification of FIG. 7. The reliability of the thermal fatigue resistance measured in the thermal fatigue test and the temperature characteristic resistance measured in the temperature cycling test can be suppressed from being degraded.

<<Modification of First Embodiment: Semiconductor Device, Rectifier S1C>>

Next, the description will be given with reference to FIGS. 8 and 9 about an example of the rectifier (S1) which further includes a zener diode 121 as a modification (the rectifier S1C) of the first embodiment.

Figure 8:
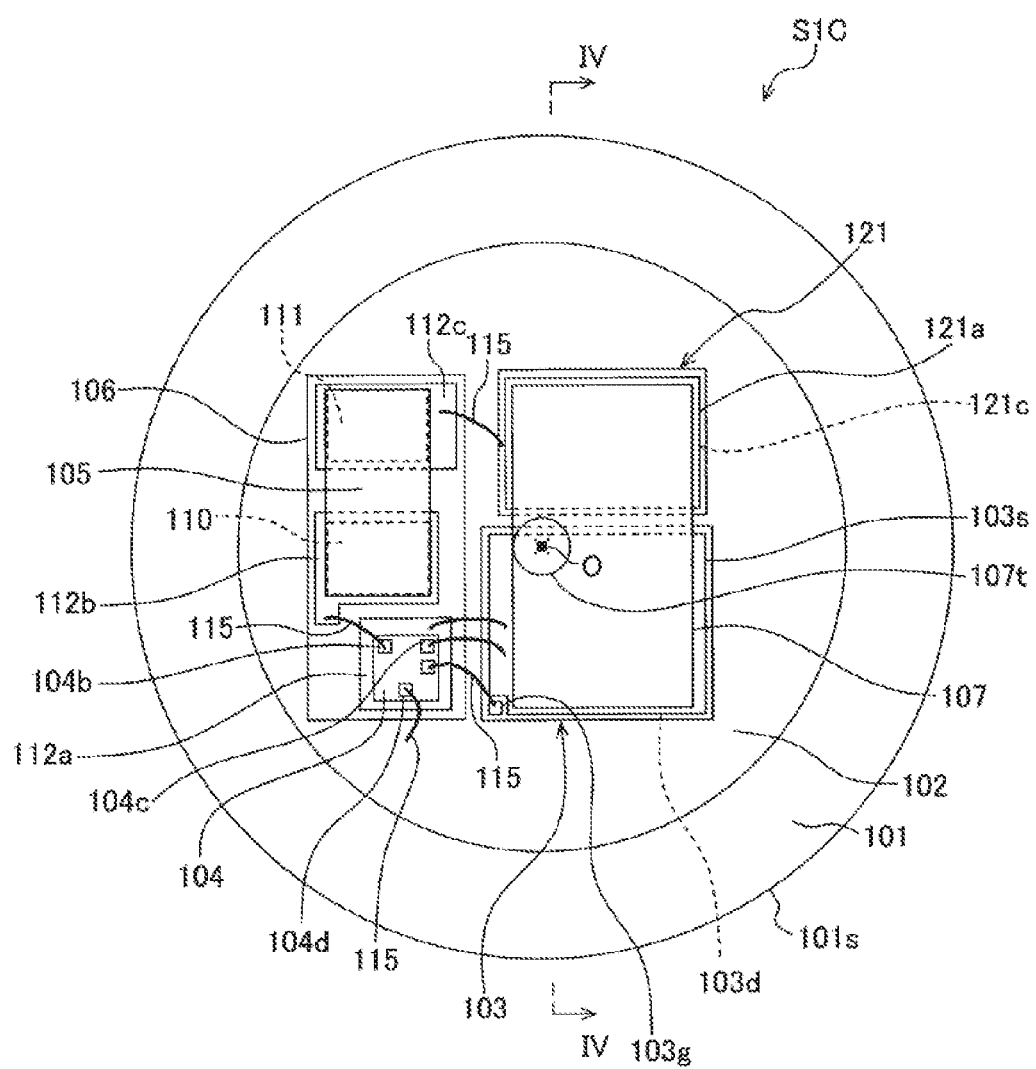
FIG. 8 is a top view illustrating a configuration of a rectifier S1C in a modification example of the semiconductor device according to the first embodiment of the invention.

FIG. 8 is a top view illustrating a configuration of the rectifier S1C in a modification of the semiconductor device (rectifier) according to the first embodiment.

Figure 9:
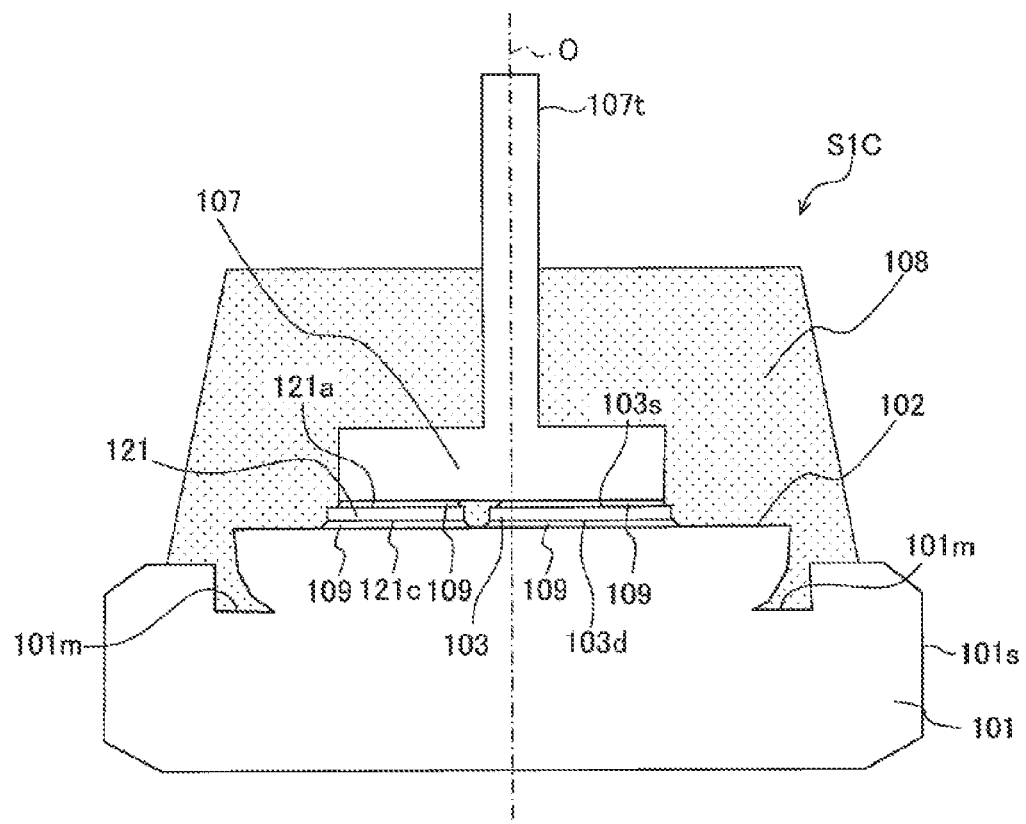
FIG. 9 is a cross-sectional view taken along a line IV-IV of FIG. 8.

In addition, FIG. 9 is a cross-sectional view taken along a line IV-IV of FIG. 8, and is a diagram when viewed from the left side in the sheet of FIG. 8.

In FIGS. 8 and 9, the rectifier S1C is configured such that the zener diode 121 is further disposed at a position near the MOSFET chip 103 on the pedestal 102. The zener diode 121 has a function of absorbing a surge voltage to be applied to the rectifier S1C.

Then, as illustrated in FIG. 9, a cathode electrode (first main terminal) 121c of the lower surface of the zener diode (zener diode chip) 121 is electrically connected to the base electrode (first external electrode) 101 through the pedestal 102, and an anode electrode (second main terminal) 121a of the upper surface of the zener diode 121 is electrically connected to the lead electrode (second external electrode) 107 using the solder 109 similarly to the MOSFET chip 103.

Therefore, the extending surface of the cathode electrode 121c of the lower surface and the extending surface of the anode electrode 121a of the upper surface of the zener diode 121 are connected (linked) with the extending surface of the pedestal 102 of the base electrode 101 and the lower surface (extending surface) of the lead electrode 107 with a wide heating surface area through the solder 109. With such a configuration, the heat of the zener diode 121 can be efficiently transferred to the base electrode 101 and the lead electrode 107.

The area of the zener diode 121 in top view is increased in a range where the chip temperature rises at the time of surge absorption without causing a defect in the solder 109 placed on and under the zener diode 121.

The heat generated in the zener diode 121 at the time of surge absorption can be transferred to the lead electrode 107 and the base electrode 101 by connecting the lead electrode 107 and the base electrode 101 on and under the zener diode 121 using the solder 109. Therefore, the temperature rise of the zener diode (zener diode chip) 121 can be suppressed, and the reliability of the zener diode 121 is improved.

As illustrated in FIG. 8, in a case where the zener diode (zener diode chip) 121 is configured as a chip separated from the MOSFET chip 103, the area of the expensive MOSFET chip 103 can be reduced. Therefore, the surge absorption function can be realized at a cheap price compared to a case where both chips (121 and 103) are built in the same chip.

<<Modification of First Embodiment: Semiconductor Device, Rectifier S1D>>

In the rectifier S1 of the first embodiment, the MOSFET chip 103 includes the gate electrode 103g in the upper surface of the chip in addition to the source electrode 103s of the upper surface of the chip and the drain electrode 103d of the lower surface of the chip. Therefore, in a case where the MOSFET chip 103 is mounted in the package equipped with the circular outer peripheral portion 101s, the positional adjustment in a direction around the rotation axis (the center axis O of the outer peripheral portion 101s of FIG. 1) in the process of forming the wiring of the gate electrode 103g becomes a problem.

Next, the description will be given with reference to FIG. 10 about an example of a notch 122 provided for the positioning in the rectifier (S1) as a modification (a rectifier S1D) of the first embodiment.

Figure 10:
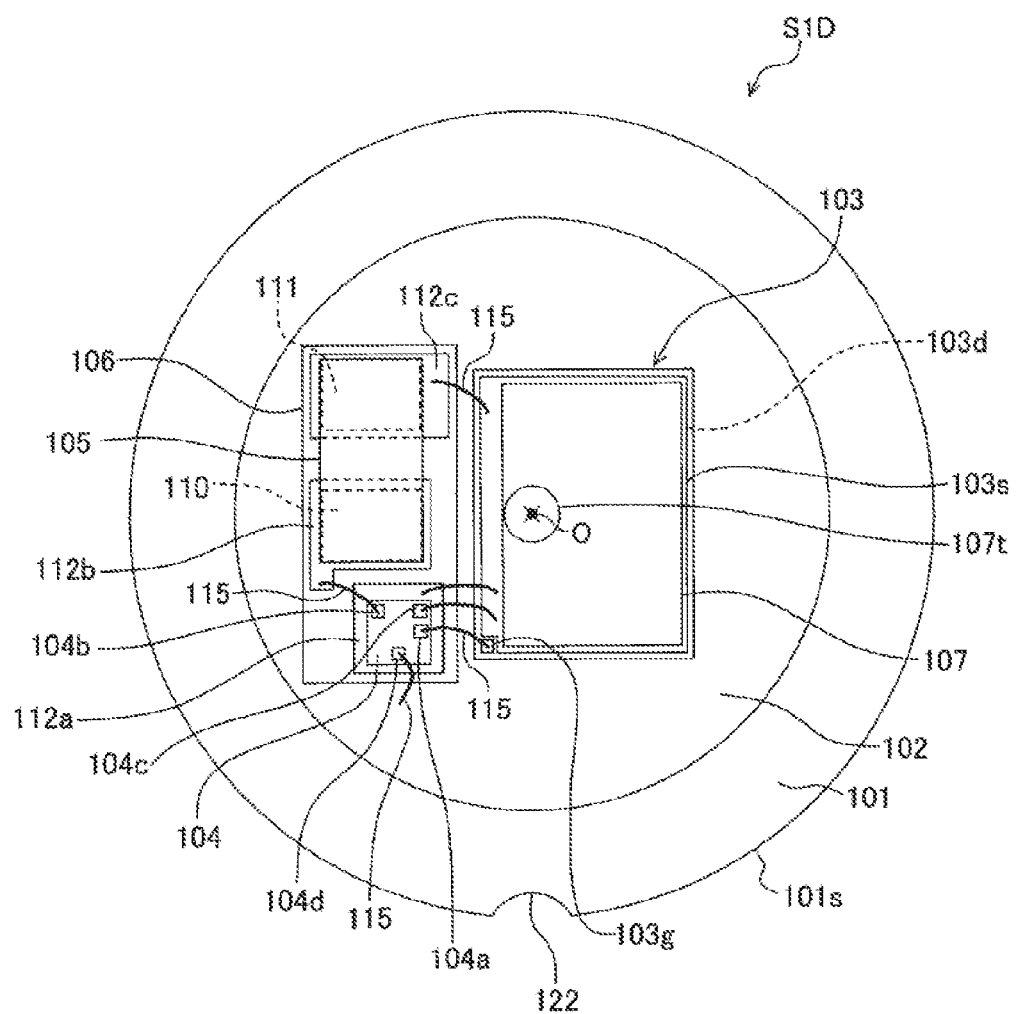
FIG. 10 is a top view illustrating a configuration of a rectifier S1D in a modification example of the semiconductor device according to the first embodiment of the invention.

FIG. 10 is a top view illustrating a configuration of the rectifier S1D in a modification of the semiconductor device (rectifier) according to the first embodiment.

As illustrated in FIG. 10, as a method of performing the positional adjustment in a direction around the rotation axis (the center axis O of the outer peripheral portion 101s of FIG. 10) in the process of forming the wiring of the gate electrode 103g, the notch 122 (a semicircular depressed portion) is provided in a part of the circular shape of the outer peripheral portion 101s of the base electrode 101 as illustrated in the top view of FIG. 10. The number of notches 122 may be one or more.

In the case of the rectifier S1 (SID) which is press-fitted and fixed to the alternator Ot (see FIG. 19), there are provided irregularities in which a mountain called the knurling 101r and the groove run in the upper and lower direction in the side wall of the outer peripheral portion 101s of the base electrode 101 illustrated in FIG. 5 as described above. Further, the irregularities are formed in a direction toward a radial direction (the outer side in the outer periphery).

The notch 122 for the positional adjustment in a direction around the rotation axis (the center axis O of the outer peripheral portion 101s of FIG. 10) becomes larger than the groove of the knurling 101r (see FIG. 5). Further, in FIG. 10, the denotation of the knurling 101r is omitted.

The shape of a hole for fixing the base electrode 101 which is formed in the carbon jig (not illustrated) used in the assembling is matched to the shape of the base electrode 101 equipped with the notch 122, and the base electrode 101 is inserted into the hole only at a position in a direction around the rotation axis.

Further, in the wire bonding apparatus, the base electrode 101 can be fixed with the direction of the notch 122.

With such a configuration, the arrangement of the components (103, 104, and 105, etc.) in the rectifier S1D is clearly determined even in the rectifier S1D of the MOSFET. Therefore, the positional adjustment in a direction around the rotation axis is not necessary at the time of soldering, and the outer peripheral portion 101s of the base electrode 101 can be easily assembled to the circular package.

Further, the rectifier S1D in the modification of the rectifier has the same configuration as that of the rectifier S1 except the notch 122, and the redundant description will be omitted.

<<Modification of First Embodiment: Semiconductor Device, Rectifier S1E>>

Next, the description will be given with reference to FIG. 11 about an example in which an orientation flat 123 is provided to be used in the positioning in the rectifier (S1) as a modification (the rectifier S1E) of the first embodiment.

Figure 11:
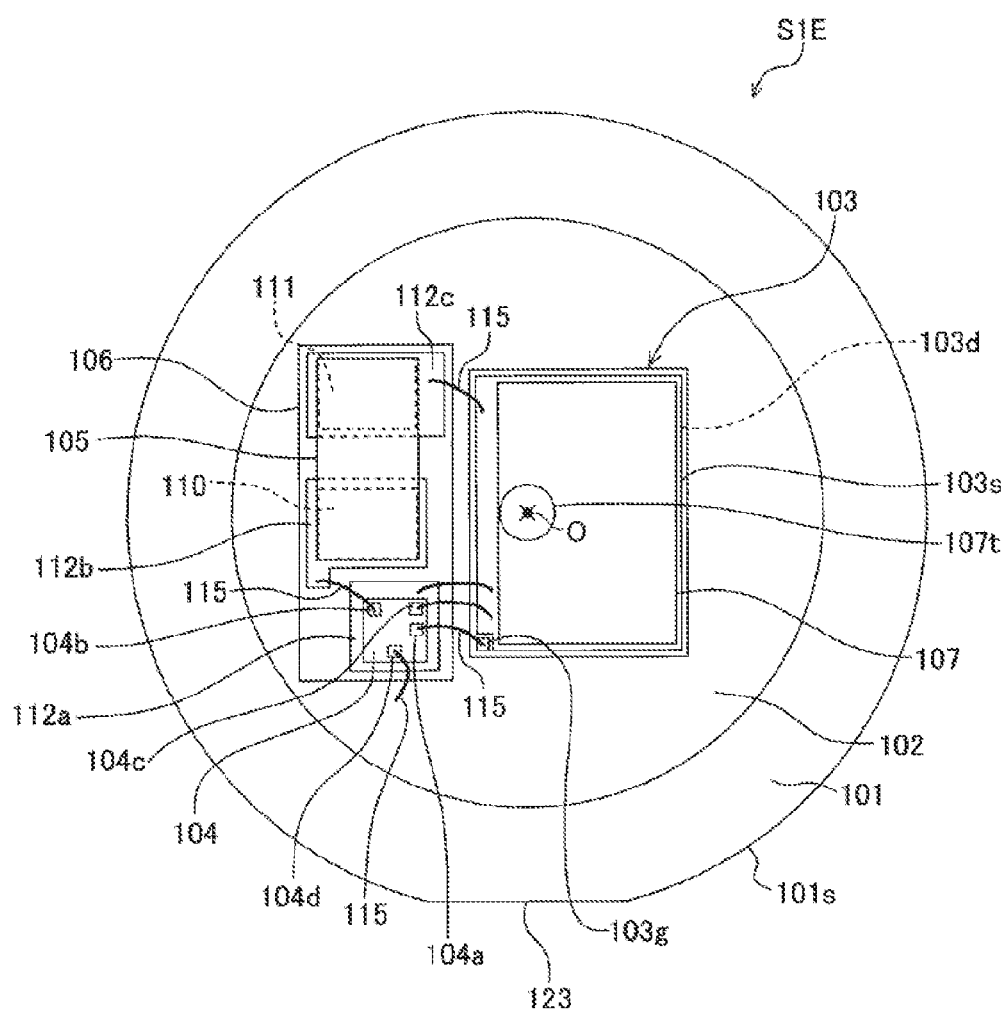
FIG. 11 is a top view illustrating a configuration of a rectifier S1E in a modification example of the semiconductor device according to the first embodiment of the invention.

FIG. 11 is a top view illustrating a configuration of the rectifier S1E in a modification of the semiconductor device (rectifier) according to the first embodiment.

As illustrated in FIG. 11, as a method of performing the positional adjustment in a direction around the rotation axis (the center axis O of the outer peripheral portion 101s of FIG. 11) in a process of forming the wiring of the gate electrode 103g, the orientation flat (hereinafter, appropriately referred to as "flat") 123 is provided in a portion of the circular shape of the outer peripheral portion 101s of the base electrode 101 such that the circumferential portion is made in a straight line shape as illustrated in the top view of FIG. 11.

The flat 123 in FIG. 11 has the same role and effect as those of the notch 122 in FIG. 10, and the redundant description will be omitted.

<<Modification of First Embodiment: Semiconductor Device, Rectifier S1F>>

Next, the description will be given with reference to FIG. 12 about an example in which a concave portion 124 for the positional adjustment is provided in the rectifier (S1) as a modification (the rectifier S1F) of the first embodiment.

Figure 12:
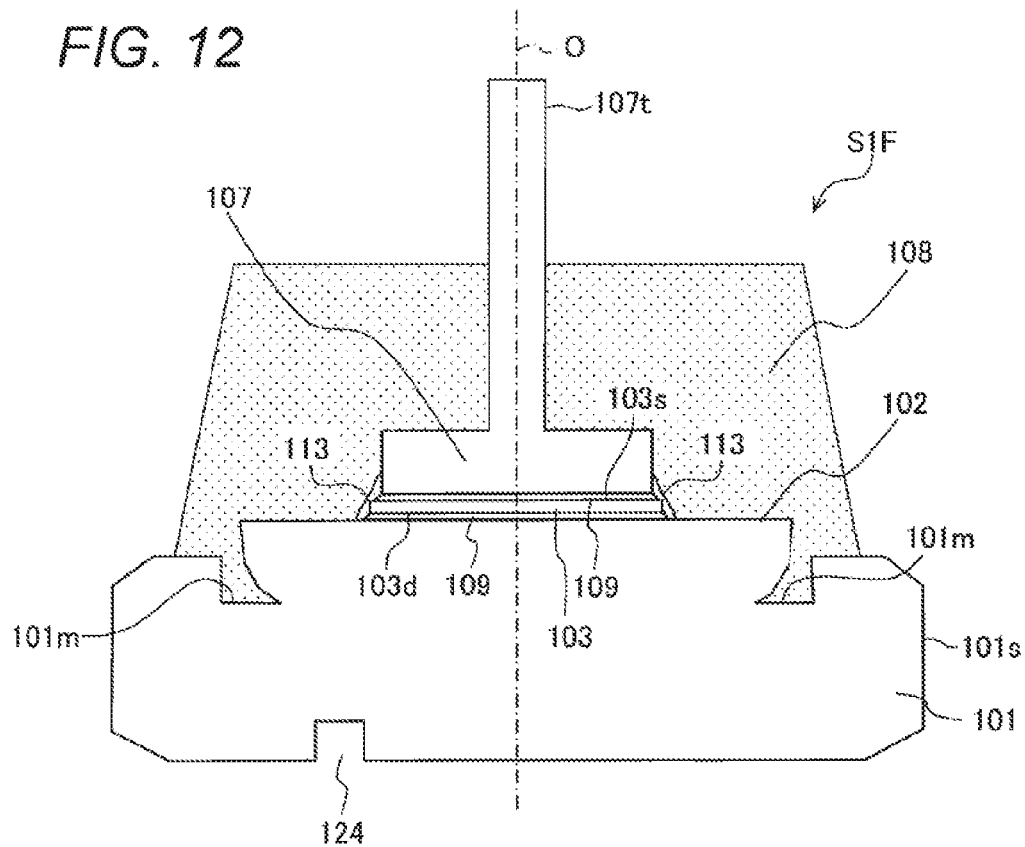
FIG. 12 is a cross-sectional view taken along a line I-I of FIG. 1 illustrating a rectifier S1F in a modification example of the semiconductor device according to the first embodiment of the invention.

FIG. 12 is a cross-sectional view taken along a line I-I of FIG. 1 illustrating a configuration of the rectifier S1F in a modification of the semiconductor device (rectifier) according to the first embodiment.

Figure 15:
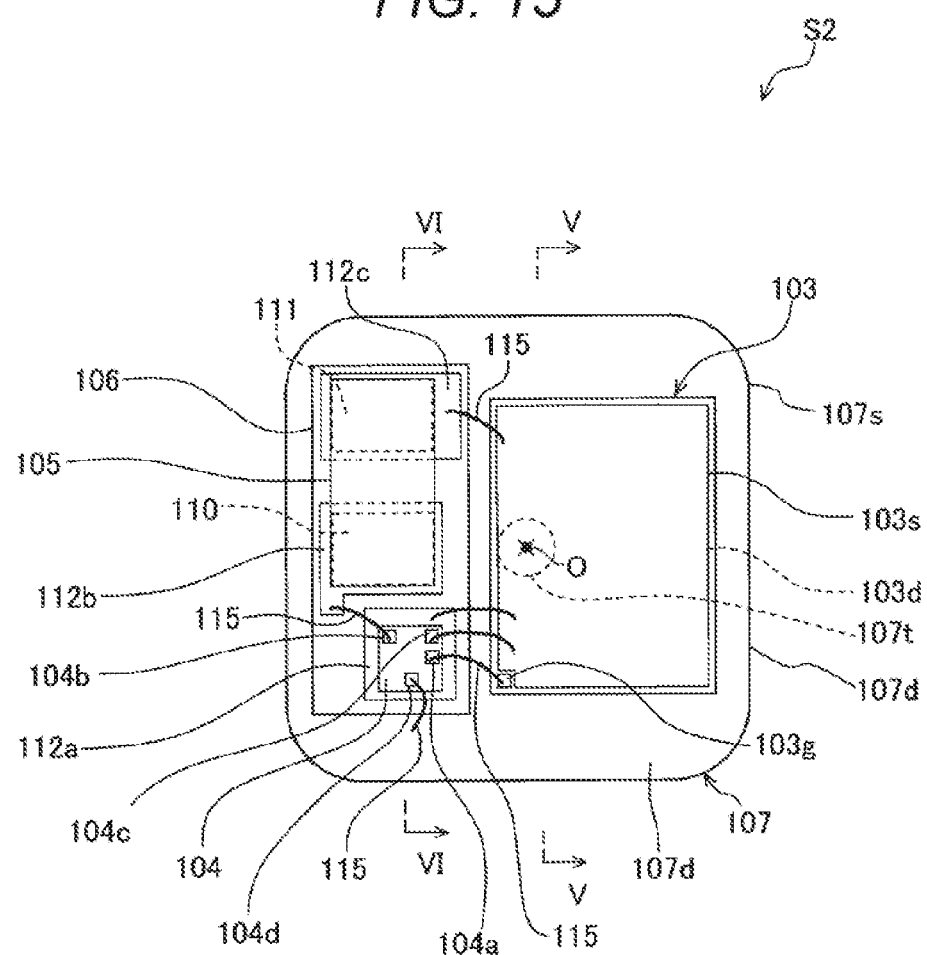
FIG. 15 is a diagram illustrating a rectifier S2 of a semiconductor device according to a second embodiment of the invention, in which a lead terminal is viewed from a source electrode connected to the base electrode.

In FIG. 12, there is provided the concave portion 124 as illustrated in FIG. 15 in the bottom of the base electrode 101 as an another method of performing the positional adjustment in a direction around the rotation axis (the center axis O of the outer peripheral portion 101s of FIG. 12).

The planar shape of the concave portion 124 in lower view may be circle, square, or rectangle as long as the circle of the outer peripheral portion 101s is symmetrical about the center axis O when the base electrode 101 is viewed from the lower side ("the base electrode 101 is viewed from the lower side of FIG. 12" will be appropriately referred also as "in lower view"), the shape of the concave portion 124 in a depth direction may be a cylindrical shape or a spherical shape, and the position of the concave portion 124 may be near the center axis O or away from the center. In addition, the number of concave portions 124 may be one or more. Further, the planar shape of the concave portion 124 in lower view is desirably a circular shape since the positional adjustment in a direction around the rotation axis is easily performed.

A projection for the positional adjustment is provided along the shape of the concave portion 124 in a fixation hole for fixing the base electrode 101 to the carbon jig used in the assembling. The base electrode 101 is configured to be inserted to the fixation hole only at a position in a direction around the predetermined rotation axis (the center axis O of the outer peripheral portion 101s of FIG. 125).

Further, a fixation projection is provided along the shape of the concave portion 124 in a fixing portion of the base electrode 101 even in the setting hole of the wire bonding apparatus. The base electrode 101 is configured to be inserted into the setting hole only at a position in a direction around the predetermined rotation axis. Therefore, the outer peripheral portion 101s can be easily assembled to the circular package even in the case of the rectifier S1 which uses the MOSFET.

A mechanism for the positional adjustment in a direction around the rotation axis is equipped in the wire bonding apparatus as still another method of performing the positional adjustment in a direction around the rotation axis (the center axis O of the outer peripheral portion 101s of FIG. 125).

For example, the mechanism for the positional adjustment in a direction around the rotation axis includes a recognition device (for example, a CCD) to recognize the arrangement of the components such as the capacitor 105, a motor which controls a rotation position, a deceleration mechanism of the motor, a rotation member which is rotated by the deceleration mechanism and performs the positional adjustment, a rotational position sensor, and a control device which controls these components to perform the positional adjustment of the wire bonding.

Then, the arrangement of the components such as the MOSFET chip 103, the control circuit chip 104, and the capacitor 105 fixed on the pedestal 102 using the solder 109 is captured by the recognition device, and the positional adjustment in a direction around the rotation axis is performed by the mechanism, and then the wire bonding is performed. In this case, the positional adjustment in the carbon jig is not necessary, so that the electrical connection other than the wire bonding is performed by one soldering process.

<<Modification of First Embodiment: Semiconductor Device, Rectifier S1G>>

Next, another method of performing the positional adjustment will be described as a modification (the rectifier S1G) of the first embodiment.

Figure 13:
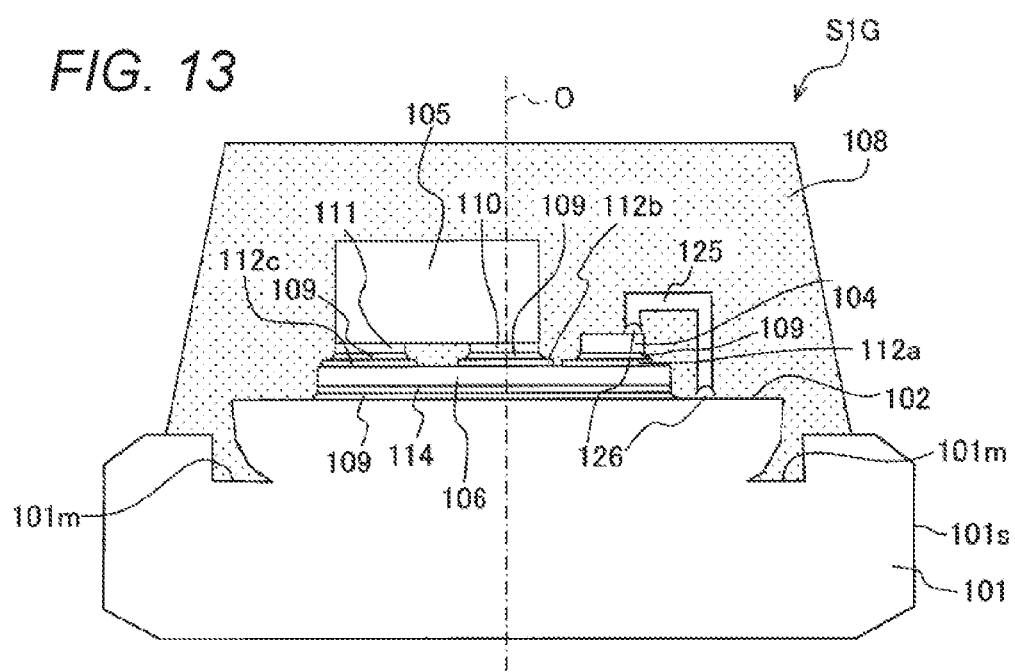
FIG. 13 is a cross-sectional view taken along a line II-II of FIG. 1 illustrating a configuration of a rectifier S1G in a modification example of the semiconductor device according to the first embodiment of the invention.

FIG. 13 is a cross-sectional view taken along a line II-II of FIG. 1 illustrating a configuration of the rectifier S1G in the modification of the semiconductor device (rectifier) according to the first embodiment.

A copper plate or copper wire 125 is formed in a connectable shape in place of the wire formed by the wire bonding and is fixed and connected by a solder ball or a solder bump 126 as illustrated in FIG. 13 as still another method of performing the positional adjustment in a direction around the rotation axis (the center axis O of the outer peripheral portion 101s of FIG. 13).

For example, in FIG. 1, all the wirings including the wiring connected by the wire 115 and those which are not illustrated in FIG. 13 are connected using the copper plate or copper wire 125 using the solder ball or the solder bump 126.

Then, a process of soldering the copper plate or copper wire 125 is performed in the same manner as the soldering process for connecting the MOSFET chip 103, the lead electrode 107, the control circuit chip 104, the isolation substrate 106, and the capacitor 105.

In other words, all the components are electrically connected by one soldering process. It is possible to omit the positional adjustment in a direction around the rotation axis (the center axis O of the outer peripheral portion 101s of FIG. 16) by electrically connecting all the components in one process.

However, the wiring on the isolation substrate 106 (that is, the wiring between the control circuit chip 104 and the electrode on the isolation substrate 106) may be separately connected and wired using the wire 115.

The reason is that the shape of the isolation substrate 106 is quadrangle (square), and the isolation substrate 106 is not necessary for the positional adjustment in a direction of the rotation axis. A positional relation between the MOSFET chip 103 and the isolation substrate 106 on the pedestal 102 is determined by the carbon jig (not illustrated), and the positional adjustment in a direction of the rotation axis does not matter.

Further, the copper plate or copper wire 125 has been exemplified as a conductor for the connection, and any conductor other than copper may be used.

<<Modification of First Embodiment: Semiconductor Device, Rectifier S1H>>

Next, a method where the positional adjustment is not necessary will be described as a modification (the rectifier S1H) of the first embodiment.

Figure 14:
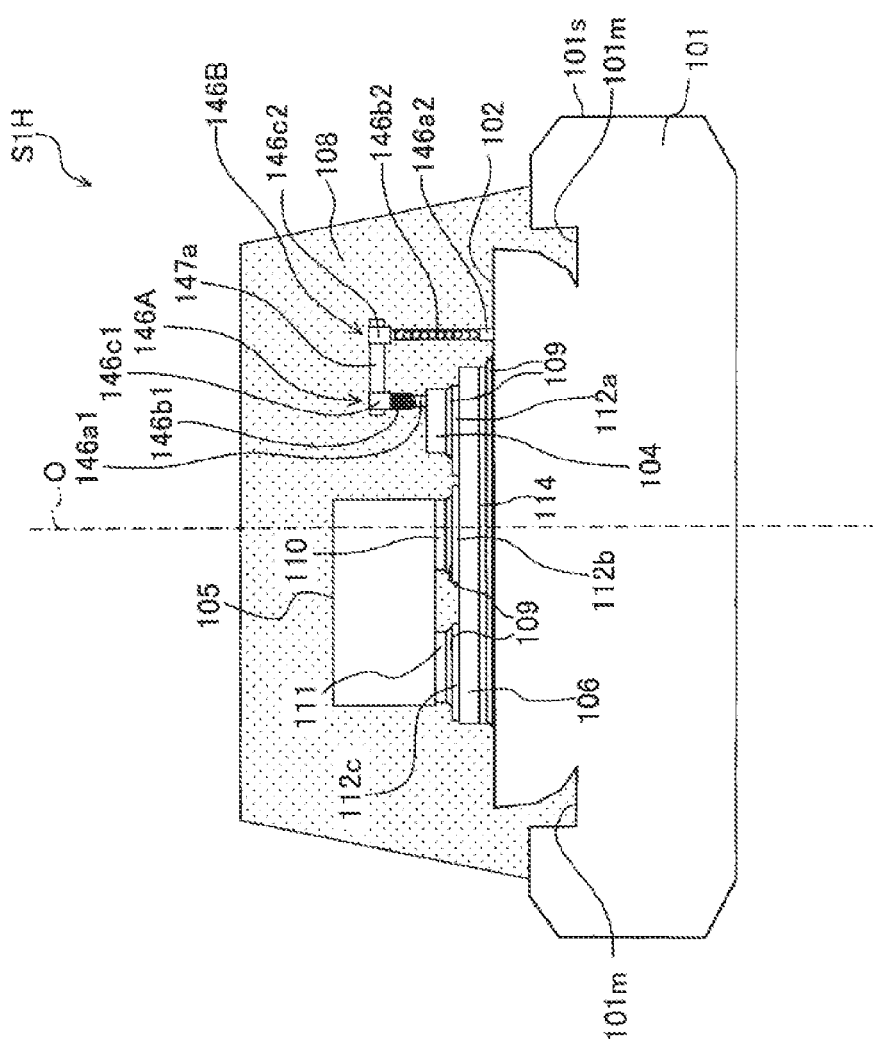
FIG. 14 is a cross-sectional view taken along a line II-II of FIG. 1 illustrating a configuration of a rectifier S1H in a modification example of the semiconductor device according to the first embodiment of the invention.

FIG. 14 is a cross-sectional view taken along a line II-II of FIG. 1 illustrating a configuration of the rectifier S1H in a modification of the semiconductor device (rectifier) according to the first embodiment.

In FIG. 13, the copper plate or copper wire 125 is connected using the solder for example. However, as illustrated in FIG. 14, pins with a spring 146A and 146B which are made of copper with a spring mechanism may be used for the electrical connection by an elastic force of the pins with a spring 146A and 146B.

As a specific configuration, the pin with a spring 146A and the pin with a spring 146B are fixed by a copper bar 147a.

The pin with a spring 146A includes a terminal 146a1 in the lower portion, a spring 146b1 in the center, and a fixing portion 146c1 in the upper portion. In addition, the pin with a spring 146B includes a terminal 146a2 in the lower portion, a spring 146b2 in the center, and a fixing portion 146c2 in the upper portion.

Then, the terminals 146a1 and 146a2 are each pressed to the second electrode 104d of the control circuit chip 104 (see FIG. 1), and to the electrode 114 of the isolation substrate 106 and the pedestal 102 of the base electrode 101 by the elastic forces of the springs 146b1 and 146b2. Therefore, the electrode (not illustrated) of the isolation substrate 106 and the pedestal 102 of the base electrode 101 are electrically connected without the solder bump (126, FIG. 13).

Further, the copper bar 147a is temporally fixed to the isolation substrate 106 using a spring (not illustrated), and then sealed and fixed by the resin 108 as illustrated in FIG. 14.

As described above, the reliability against the connection failure of the wiring can be improved by using the pins with a spring 146A and 146B in place of the wire 115 for the wiring.

Figure 17:
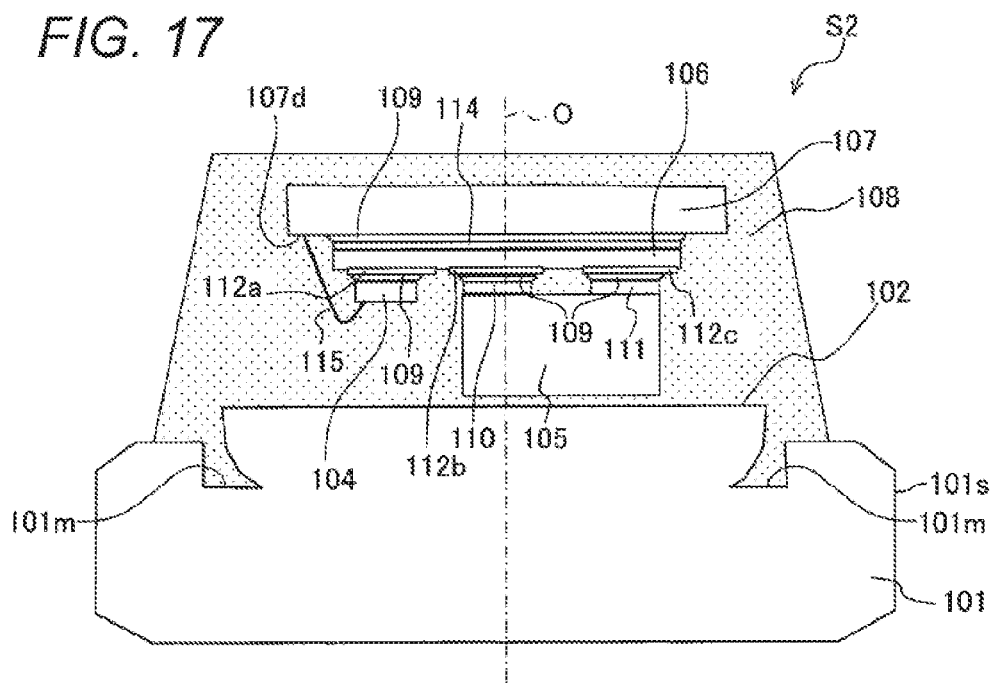
FIG. 17 is a cross-sectional view taken along a line VI-VI of FIG. 15.

The other wirings connected using the wire 115 in FIG. 1, which are not illustrated in FIG. 17, are also included, and are connected by the pins with a spring 146A and 146B fixed using the copper bar 147a illustrated in FIG. 14.

Then, the process of connecting the pins with a spring 146A and 146B fixed to the electrode using the copper bar 147a is simultaneously performed with the soldering process of connecting the MOSFET chip 103, the lead electrode 107, the control circuit chip 104, the isolation substrate 106, and the capacitor 105.

In other words, all the components are electrically connected by one soldering process. It is possible to omit the positional adjustment in a direction around the rotation axis (the center axis O of the outer peripheral portion 101s of FIG. 16) by electrically connecting all the components in one process.

<<Second Embodiment: Semiconductor Device and Rectifier S2>>

A configuration of a semiconductor device (the rectifier S2) according to a second embodiment of the invention will be described with reference to FIGS. 15 to 17.

The description has been given about that there are the configuration on a forward side and the configuration on a reverse side of the rectifier, but the rectifier (semiconductor device) S1 of the first embodiment is the forward side rectifier, and the rectifier (semiconductor device) S2 of the second embodiment is a reverse side rectifier.

FIG. 15 is a diagram illustrating the rectifier S2 in which the lead terminal 107t (the lead electrode 107) is viewed from the source electrode 103s connected to the base electrode 101 by an electrode block 127 described below.

Figure 16:
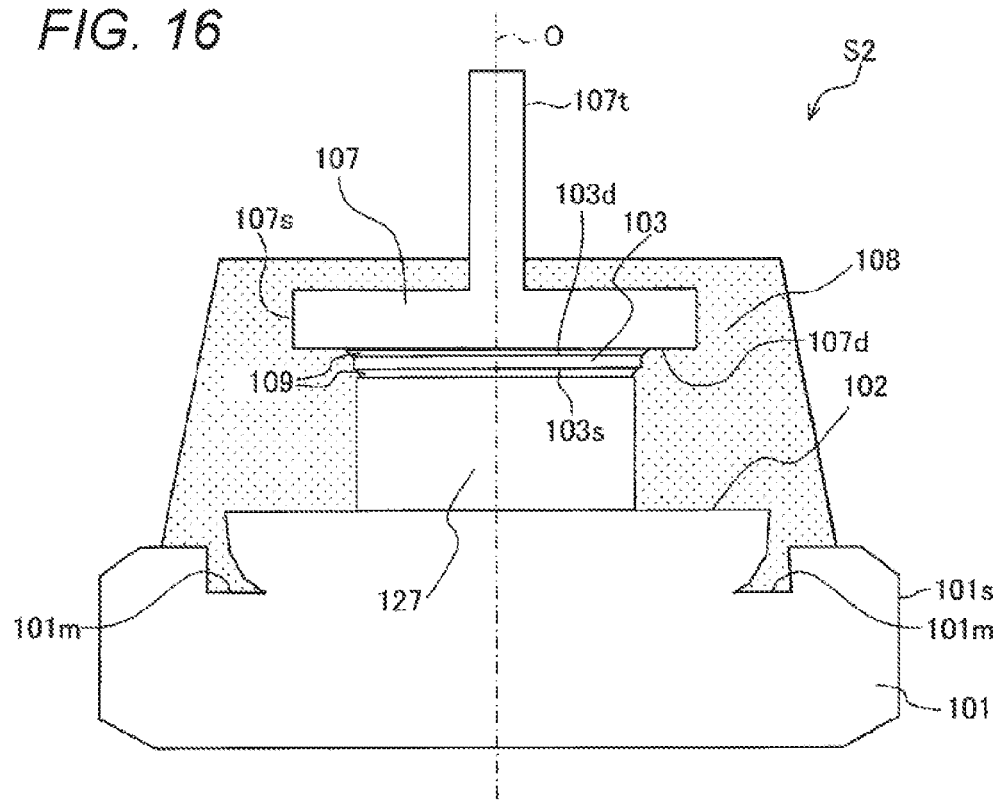
FIG. 16 is a cross-sectional view taken along a line V-V of FIG. 15.

In addition, FIG. 16 is a cross-sectional view taken along a line V-V of FIG. 15 when viewed from the left side in the sheet of FIG. 15.

In addition, FIG. 17 is a cross-sectional view taken along a line VI-VI of FIG. 15 when viewed from the left side in the sheet of FIG. 15.

FIG. 15 is a diagram illustrating the rectifier S2 in which the lead terminal 107t (the lead electrode 107) is viewed from the source electrode 103s as described above. In other words, the lead terminal 107t (the lead electrode 107) is viewed from the source electrode 103s in FIG. 16, and thus the base electrode 101 is not seen. In addition, the lead terminal 107t is hidden by the lead electrode 107.

Therefore, the base electrode 101 is not illustrated in FIG. 15.

However, a pedestal 107d is denoted for convenience sake in order to easily recognize that the MOSFET chip 103, the control circuit chip 104, the capacitor 105, the isolation substrate 106 are built in.

Further, the pedestal 107d indicates the surface where the components (103, 104, 105, and 106) of the lead electrode 107 are built, and is part of the lead electrode 107.

In addition, in FIG. 15, the lead terminal 107t is directly not seen due to the arrangement relation with respect to the lead electrode 107, and thus depicted by a broken line (circular shape).

In addition, since not seen from the source electrode 103s, the source electrode 103s is depicted by a solid line. The drain electrode 103d is hidden by the source electrode 103s, and thus the indicating line of the drain electrode 103d is depicted by a broken line.

As illustrated in FIGS. 15 to 17, the rectifier S2 of the MOSFET according to the second embodiment includes the lead electrode 107 (see FIG. 15) which includes a rectangular outer peripheral portion 107s, the pedestal 107d in which the components to be provided in the lead electrode 107 are placed, the MOSFET chip 103 which is placed on the pedestal 107d, and the isolation substrate 106 which is placed on the pedestal 107d.

Further, the rectifier S2 includes the control circuit chip 104 when being mounted on the electrode 112a provided on the isolation substrate 106, and the capacitor 105 when being mounted on the electrodes 112b and 112c provided on the isolation substrate 106.

Further, the rectifier S2 includes the electrode block 127 (see FIG. 16) which is placed on the MOSFET chip 103, the base electrode 101, the pedestal 102 which is provided in the base electrode 101, the pedestal 107d which is provided in the lead electrode 107, and the resin 108 which covers the components (103, 104, and 105) and the isolation substrate 106.

The MOSFET chip 103, the control circuit chip 104, the capacitor 105, and the isolation substrate 106 of the reverse side rectifier S2 are used the same components as those of the forward side rectifier S1 (see FIGS. 1 to 3) illustrated in the first embodiment.

In this way, the component costs can be reduced by mass production of the components by using the same components for the forward side rectifier S1 and the reverse side rectifier S2.

In FIG. 15, the shape of the pedestal 107d of the lead electrode 107 when the lead electrode 107 is viewed from the pedestal 102 of the base electrode 101 of FIG. 16 (appropriately referred also to as "in lower view") is depicted as a quadrangle, but may be a circle.

When being formed in a quadrangle in lower view, the pedestal 107d of the lead electrode 107 has the shape along the same shape (quadrangle) of the MOSFET chip 103, the control circuit chip 104, and the capacitor 105, so that it is possible to reduce the area of the pedestal 107d.

On the other hand, in a case where the pedestal 107d of the lead electrode 107 is formed in a circle in lower view, the stress of the end portion of the pedestal 107d can be made small while avoiding that the stress is concentrated.

The connection and arrangement of the respective components illustrated in FIGS. 15 to 17 of the second embodiment are the same as those of the rectifier S1 of the MOSFET according to the first embodiment illustrated in FIG. 1 except that the components (103 to 106) is connected by replacing the base electrode 101 and the lead electrode 107, and the electrode block 127 is inserted between the MOSFET chip 103 and the base electrode 101.

The electrode block 127 is a member to provide a gap between the base electrode 101 and the pedestal 107*d* of the lead electrode 107.

In other words, as illustrated in FIG. 17, the capacitor 105 is disposed between the lead electrode 107 (the pedestal 107*d*) and the base electrode 101 (the pedestal 102) in the reverse side rectifier S2. Therefore, there is a need to secure a space for disposing the capacitor 105 which has a relatively large height, and the lead electrode 107 (the pedestal 107*d*) and the base electrode 101 (the pedestal 102) are separated from each other to have a sufficient gap.

When the gap between the lead electrode 107 (the pedestal 107*d*) and the base electrode 101 (the pedestal 102) is increased, as illustrated in FIG. 16, the MOSFET chip 103 fitted to the pedestal 107*d* of the lead electrode 107 and the pedestal 102 of the base electrode 101 are separated too much, and thus it is not good for the electrical connection and fixation.

The electrode block 127 functions to compensate the gap too much separated between the MOSFET chip 103 and the pedestal 102 of the base electrode 101.

Further, the electrode block 127 may be formed to be integrated to the base electrode 101.

As illustrated in FIG. 16, the drain electrode 103*d* of the lower surface of the MOSFET chip 103 is electrically connected to the pedestal 107*d* of the lead electrode 107 using the solder 109.

With such an arrangement and a connection, the extending surface of the drain electrode 103*d* of the lower surface of the MOSFET chip 103 and the extending surface of the lead electrode 107 are connected (linked) in a large heating surface area through the solder 109.

In addition, the source electrode 103*s* of the upper surface of the MOSFET chip 103 is electrically and thermally connected to the pedestal 102 of the base electrode 101 through the electrode block 127 using the solder 109.

Therefore, the extending surface of the source electrode 103*s* of the upper surface of the MOSFET chip 103 and the extending surface of the pedestal 102 of the base electrode 101 are connected (linked) in a large heating surface area through the electrode block 127.

As illustrated in FIG. 17, the control circuit chip 104 is fixed to the electrode 112*a* provided on the isolation substrate 106 using the solder 109.

The control circuit chip 104 and the capacitor 105 are fixed to the electrodes 112*b* and 112*c* provided on the isolation substrate 106 using the solder 109.

The isolation substrate 106 is fixed to the pedestal 107*d* of the lead electrode 107 using the solder 109.

In addition, the gate electrode 103*g* of the upper surface (the surface on a side near the source electrode) of the MOSFET chip 103 is electrically connected by the wire 115 to the first electrode 104*a* of the upper surface (the surface on any side of the control circuit chip 104 and the capacitor 105) of the control circuit chip 104 as illustrated in FIG. 15.

In addition, the high voltage side terminal 110 of the capacitor 105 is similarly electrically connected to the electrode 112*b* of the upper surface of the isolation substrate 106 using the solder 109. In addition, the electrode 112*b* of the upper surface of the isolation substrate 106 is connected to the second electrode 104*b* (see FIG. 15) provided in the upper surface of the control circuit chip 104 by the wire 115.

In addition, the low voltage side terminal 111 of the capacitor 105 is similarly electrically connected to the electrode 112*c* of the upper surface of the isolation substrate 106 using the solder 109. In addition, the electrode 112*c* of the upper surface of the isolation substrate 106 is connected to the source electrode 103*s* of the upper surface of the MOSFET chip 103 by the wire 115.

As described above, as illustrated in FIG. 15, the reverse side rectifier S2 is configured such that the first electrode 104*a* (one of the electrodes) of the upper surface of the control circuit chip 104 is electrically connected to the gate electrode 103*g* of the MOSFET chip 103 by the wire 115.

In addition, the second electrode 104*b* (another electrode) of the upper surface of the control circuit chip 104 is electrically connected to the electrode 112*b*3 of the upper surface of the isolation substrate 106 connected to the high voltage side terminal 110 of the capacitor 105 by the wire 115.

Further, the third electrode 104*c* (another electrode) of the upper surface of the control circuit chip 104 is electrically connected to the source electrode 103*s* of the MOSFET chip 103, and the fourth electrode 104*d* (another electrode) of the upper surface of the control circuit chip 104 is electrically connected to the pedestal 107*d* of the lead electrode 107 by the wire 115.

<Supplement of Reverse Side and Forward Side>

The rectifier S1 of the MOSFET according to the first embodiment described with reference to FIGS. 1 to 3 is a rectifier used in an upper arm of a rectifying circuit of the alternator Ot called a forward side (see FIG. 18). As illustrated in FIG. 2, the drain electrode 103*d* of the MOSFET chip 103 is connected to the base electrode 101, and the source electrode 103*s* of the MOSFET chip 103 is connected to the lead electrode 107.

With this regard, the rectifier S2 of the MOSFET according to the second embodiment of the invention described with reference to FIGS. 15 to 17 is a rectifier used in a lower arm (see FIG. 18) of the rectifying circuit of the alternator Ot called a reverse side.

As illustrated in FIG. 16, the drain electrode 103*d* of the MOSFET chip 103 is connected to the lead electrode 107, and the source electrode 103*s* of the MOSFET chip 103 is connected to the base electrode 101.

In this way, the reverse side rectifier S2 can be realized and used.

<Circuit Configuration and Circuit Operation of Rectifier S2>

A circuit configuration and a circuit operation of the rectifier S2 of the MOSFET according to the second embodiment are the same as the circuit configuration and the circuit operation of the rectifier S2 of the MOSFET according to the first embodiment described using FIG. 5.

Since the same components and the same circuits as those of the forward side rectifier S1 of the first embodiment will be used in the reverse side rectifier S2 of the second embodiment, the design cost and a development cost can be reduced. Since the components can be subjected to the same test, the test cost can also be reduced. In addition, the cost can also be reduced by mass production of the same components and the same circuits.

With regard to the characteristics and the effects of the rectifier S2 of the MOSFET according to the second embodiment, the same characteristics as those of the rectifier S1 of the MOSFET according to the first embodiment can be obtained, and the same effect can be achieved.

<Assembling Method of Rectifier S2>

A method of assembling the rectifier S2 of the MOSFET according to the second embodiment is basically the same as that of the rectifier S1 of the MOSFET according to the first embodiment.

A difference is, as illustrated in FIGS. 16 and 17, that the components (103, 104, and 105) are placed on the pedestal 107d of the lead electrode 107 in place of the pedestal 102 of the base electrode 101, and connected to the isolation substrate 106 to which the MOSFET chip 103, the control circuit chip 104, and the capacitor 105 are fixed.

Then, the electrode block 127 serving as an electrode and also a spacer is provided between the MOSFET chip 103 and the base electrode 101. Further, since the pedestal 107d of the lead electrode 107 has no need to be made in a circular shape in lower view, the method of performing the positional adjustment in a direction of the rotation axis may be necessarily employed at the time of assembling in the rectifier S1 of the MOSFET according to the first embodiment. For example, in a case where the pedestal 107d of the lead electrode 107 is made in a square shape in lower view as illustrated in FIG. 15, the components (103, 104, and 105) are laid out using the sides.

With this regard, in a case where the pedestal 107d of the lead electrode 107 is made in a circular shape in lower view, the arrangement on the pedestal 107d is hardly specified. Therefore, there is applied the method of performing the positional adjustment in a direction around the rotation axis (the center axis O) as illustrated in FIGS. 10 to 12 similarly to the case of the rectifier S1 of the MOSFET according to the first embodiment.

<<Third Embodiment: Alternator>>

Next, the description will be given with reference to FIGS. 18 to 20 about the alternator Ot which is configured to include the rectifier S1 of the first embodiment and the rectifier S2 of the second embodiment. The alternator Ot generates an AC power (voltage) by a generator (a rotor 128 and a stator 129), rectifies the AC power (voltage) by a rectifying apparatus Os, and generates and outputs a DC power (voltage).

Figure 18:
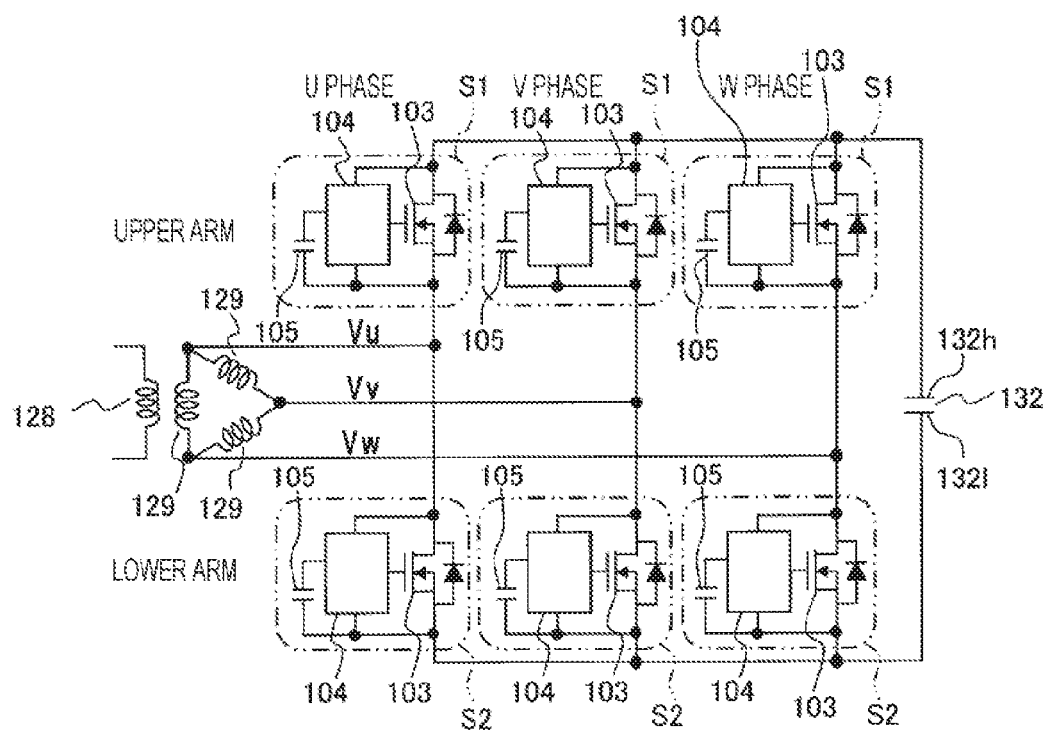
FIG. 18 is a circuit diagram illustrating a circuit configuration of a three-phase full-wave rectification using six rectifiers.

FIG. 18 is a circuit diagram illustrating a circuit configuration of a three-phase full-wave rectification (the rectifying apparatus Os) which uses six rectifiers.

FIG. 19 is a diagram illustrating an outline of the configuration and the structure of the alternator Ot.

Figure 20:
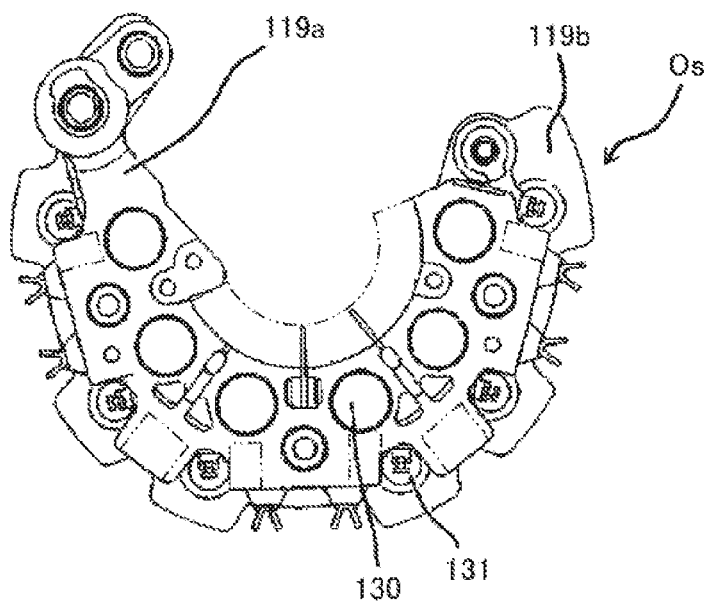
FIG. 20 is a plan view schematically illustrating a rectifying apparatus provided in the alternator according to the third embodiment of the invention.

FIG. 20 is a schematic plan view of the rectifying apparatus Os which is provided in the alternator Ot.

<Configuration Rectifying Circuit of Alternator Ot>

The description will be given with reference to FIG. 18 about the configuration of the rectifying circuit of the alternator Ot (see FIG. 19) which uses the rectifiers S1 and S2 of the autonomous MOSFET of the invention.

FIG. 18 is a circuit diagram illustrating the circuit configuration of the three-phase full-wave rectification (the rectifying apparatus Os) which uses six rectifiers as described above.

In FIG. 18, the circuit of the three-phase full-wave rectification is configured by three forward side rectifiers S1 and three reverse side rectifiers S2.

Three output voltages (U, V, and W phases) of the AC generator which includes the coil of the rotor 128 and three coils of the stator 129 are input to the three-phase full-wave rectifying circuit to be converted into the DC voltage, and is output to a battery 132.

Next, the detailed description will be given.

The three forward side rectifiers S1 of the first embodiment are provided on a upper side (high voltage side: a side near a high voltage side terminal 132h of the battery 132) of a neutral wiring (a contact point between the upper arm and the lower arm, a wiring toward an intermediate point) of the U, V, and W-phase AC voltages (powers). The L terminals (the source electrodes 103s) of these components are each connected to the neutral wiring of the U, V, and W phases.

The H terminals (the drain electrodes 103d) of these three forward side rectifiers S1 are commonly connected to the high voltage side terminal 132h of the battery 132.

In addition, the three reverse side rectifiers S2 of the first embodiment are provided on a lower side (low voltage side: a side near a low voltage side terminal 132l of the battery 132) of the neutral wiring of the U, V, and W phases. The H terminals (the drain electrodes 103d) of these components are each connected to the neutral wiring of the U, V, and W phases.

The L terminals (the source electrodes 103s) of these three reverse side rectifiers S2 are commonly connected to the low voltage side terminal 132l of the battery 132.

Further, the reason that the U, V, and W wirings are also called the "neutral wiring" is that the wiring is connected to the contact point (intermediate, center) between the upper arm and the lower arm of the rectifying apparatus Os as described above.

The circuit configurations of the rectifiers S1 and S2 are the circuit configuration illustrated in FIG. 5, and are configured by the MOSFET chip 103, the control circuit chip 104, and the capacitor 105.

The rectifier S1 on the upper side (upper arm) and the rectifier S2 on the lower side (lower arm) use similarly the MOSFET chip 103, the control circuit chip 104, and the capacitor 105.

The rectifiers S1 and S2 of the MOSFET have two terminals, and thus can make the configuration of the rectifying circuit equal to that of the alternator which uses the rectifier (two terminals) of the conventional diode as illustrated in FIG. 18.

In addition, in FIG. 18, the stator 129 having three coils of the AC generator is configured by a Δ connection for example, and may be a Y connection.

<Operation of Rectifying Circuit of Alternator Ot>

The description will be given about the operation of the rectifying circuit of the alternator Ot which uses the rectifiers S1 and S2 of the MOSFET of the invention illustrated in FIG. 18.

The alternator Ot illustrated in FIG. 19 generates power by making the rotor (coil) 128 rotate about the stator (coil) 129. At this time, AC voltages (powers) are generated in the coils of the respective U, V, and W phases.

In the case of the U phase, a voltage Vu of the neutral wiring of the U phase fluctuates periodically by the AC voltage (power).

The description will be given about a case where the voltage Vu of the neutral wiring of the U phase rises and the rectifier S1 on the upper side performs a rectification operation.

When the voltage Vu of the neutral wiring of the U phase rises, and the voltage Vu of the neutral wiring of the U phase (that is, the voltage of a source terminal (the source electrode 103s) of the MOSFET chip 103 on the upper side reaches a voltage VB of the high voltage side terminal 132h of the battery 132, the voltage of a second input terminal 116i2 of the comparator 116 becomes larger than the voltage of a first input terminal 116i1 of the comparator 116 connected to a drain terminal (the drain electrode 103d) of the MOSFET chip 103 illustrated in FIG. 5. Therefore, the voltage of the output terminal 116o of the comparator 116 rises from the low-voltage state to a high-voltage state.

Then, the gate driver 117 is driven to raise the voltage of a gate terminal (the gate electrode 103g) of the MOSFET chip 103, and thus the MOSFET chip 103 becomes the ON state.

Therefore, the current flows from the source terminal (the source electrode 103s) of the MOSFET chip 103 to the drain terminal (the drain electrode 103d), and rectified.

The voltage Vu of the neutral wiring of the U phase illustrated in FIG. 18 falls, and the voltage Vu of the neutral wiring of the U phase reaches the voltage VB of the drain terminal (the drain electrode 103d) of the MOSFET chip 103 on the upper side, the voltages of the two input terminals (116i1 and 116i2) of the comparator 116 in FIG. 5 is reversed in amplitude, and the voltage of the output terminal 116o of the comparator 116 falls from the high-voltage state to the low-voltage state.

Therefore, the gate driver 117 lowers the voltage of the gate terminal (the gate electrode 103g) of the MOSFET chip 103 to make the MOSFET chip 103 enter the OFF state. In other words, the source terminal (the source electrode 103s) and the drain terminal (the drain electrode 103d) are electrically disconnected.

The rectification operation of the rectifier S2 on the lower side (lower arm) is also the same as that of the rectifier S1 on the upper side (upper arm) described above. When the voltage Vu of the neutral wiring of the U phase falls again and reaches the voltage of the low voltage side terminal of the battery 132, the MOSFET chip 103 enters the ON state. When the voltage Vu of the neutral wiring of the U phase rises again and reaches the voltage of the low voltage side terminal of the battery, the MOSFET chip 103 enters the OFF state and the rectification is performed.

Hitherto, the description has been given about the rectifier S1 and the rectifier S2 of the U phase, and the V and W phases also operate in the same manner.

The three-phase full-wave rectification is performed by total six rectifiers S1 and S2, three of which are each connected to the U, V, and W phases.

<Outline of Configuration and Structure of Alternator Ot>

The description will be given with reference to FIGS. 19 and 20 about the alternator Ot which uses the rectifiers S1 and S2 of the MOSFET.

FIG. 19 is a diagram illustrating an outline of the configuration of the alternator Ot according to the embodiment of the invention. The alternator Ot is configured by the rectifying circuit (the rectifying apparatus Os) of the three-phase full-wave rectification using total twelve rectifiers (S1 and S2), each of which is configured by six.

In FIG. 19, the alternator Ot includes a front frame 134, a rear frame 135, a rectifying apparatus (Os) 136 to which the rectifiers S1 and S2 are press-fitted and fixed, the rotor 128, the stator 129, a brush 137, an IC regulator 138, and a protection cover 139. In addition, a slip ring 140, a field winding 141, a rotor core 142, a pulley 143, and a shaft 144 are provided.

In addition, there are provided with heat dissipation plates 119a and 119b, and assembled to the rectifying apparatus (Os) 136 to which the rectifiers S1 and S2 are fixed. Further, a connection terminal 133 connects the rectifiers S1 and S2.

In the alternator Ot having the rotor (coil) 128 and the stator (coil) 129, each rotor core 142 is excited when the field winding 141 receives an excitation current through the brush 137 and the slip ring 140.

In the state where each rotor core 142 is excited, when a rotation driving force is transferred from the engine (not illustrated) of a vehicle to the shaft 144 through the pulley 143 and the rotor 128 rotates, the AC power (voltage) is generated in the stator (coil) 129 by electromagnetic induction.

As illustrated in FIG. 18, the AC power (voltage) generated in the stator (coil) 129 is rectified by the forward side rectifier S1 and the reverse side rectifier S2, and output as the DC power (voltage) for driving the electric machines and the battery 132 built in the vehicle through an output terminal 145.

Further, the alternator Ot configured as described above is featured in that the rectifiers S1 and S2 of the embodiment are used. The other configurations are substantially the same as those of a typical alternator, and thus the detailed description other than the rectifiers S1 and S2 and the rectifying apparatus Os will be omitted.

The above configurations are the same as those of the alternator which uses a typical diode rectifier in addition to the heat dissipation plates 119a and 119b. When the rectifiers S1 and S2 of the MOSFET are used, there is no need to change the structure itself of the alternator. Therefore, a reduction in cost and an improve in versatility can be realized still more.

FIG. 20 is a plan view of the rectifying apparatus Os to which the plurality of rectifiers S1 and S2 of the MOSFET of this embodiment (the invention) are fixed. The rectifying apparatus Os in FIG. 19 is taken out and illustrated in an enlarged scale.

In FIG. 20, the rectifier S1 and the rectifier S2 are denoted by symbols 130 and 131, respectively. There are six rectifiers having the same shape as that of symbol 130. In addition, there are six rectifiers having the same shape as that of symbol 131. The left five rectifiers are not denoted by the symbols.

In addition, as to be described below, the heat dissipation plates 119a and 119b are provided in the rectifying apparatus Os to alleviate the heating of the rectifiers S1 and S2.

The rectifier S1 indicated by symbol 130 is attached to the heat dissipation plate 119a on a positive electrode side, and the rectifier S2 indicated by symbol 131 is attached to the heat dissipation plate 119b on a negative electrode side.

The heat dissipation plate 119a and the heat dissipation plate 119b are assembled in a front-back relation to each other, and thus the visual appearances of the rectifiers S1 and S2 are different.

In other words, the shape indicated by symbol 130 and the shape indicated by symbol 131 are denoted differently, and the shape viewed from above and below the rectifiers (S1 and S2) are different.

Further, while the description in FIG. 18 has been given about the rectifying circuit in a case where three rectifiers S1 and three rectifiers S2 are provided, the rectifying circuit illustrated in FIG. 20 has two times the rectifiers (that is, six rectifiers S1 and six rectifiers S2).

In FIG. 20 more specifically, the rectifying apparatus Os to which the rectifiers S1 and S2 (130 and 131) are fixed includes the forward side rectifier S1 and the heat dissipation plate 119a on the positive electrode side of a heat radiation member in which the plurality of these forward side rectifiers S1 (see FIG. 6) are press-fitted and fixed.

In addition, there is provided the reverse side rectifier S2 and the heat dissipation plate 119b on the negative electrode side of the heat radiation member in which the plurality of these reverse side rectifiers S2 are press-fitted and fixed.

In addition, the forward side rectifier S1 and the reverse side rectifier S2 are electrically connected. There is provided the connection terminal 133 (FIG. 19) with a certain isolation distance between the heat dissipation plate 119a on the positive electrode side and the heat dissipation plate 119b on the negative electrode side.

The lead electrode 107 of the forward side rectifier S1 and the lead electrode 107 of the reverse side rectifier S2 are disposed to face each other, and connected to the connection terminal 133.

As described above, since the rectifiers S1 and S2 include the base electrode 101 equipped with the circular outer peripheral portion 101s, the plurality of rectifiers S1 and S2 can be press-fitted and fixed to the heat dissipation plates 119a and 119b with ease, respectively.

As described above, in the U, V, and W-phase rectifiers on the upper side (upper arm), the drain electrode 103d of the MOSFET chip 103 is electrically connected to the common terminal. Therefore, the forward side rectifier S1 in which the drain electrode 103d is electrically connected to the base electrode 101 having a high heat radiation property is used on the upper side.

Therefore, the U, V, and W-phase rectifiers on the upper side can be fixed to one heat dissipation plate 119a, and a larger heat radiation effect can be obtained by using the larger heat dissipation plate.

On the other hand, the source electrodes 103s of the MOSFET chips 103 in the U, V, and W-phase rectifiers on the lower side (lower arm) are electrically connected to the common terminal. Therefore, the reverse side rectifier S2 in which the source electrode 103s is electrically connected to the base electrode 101 having a high heat radiation property is used on the lower side.

With such an arrangement and a connection, the U, V, and W-phase rectifiers on the lower side can be fixed to one heat dissipation plate 119b, and a larger heat radiation effect can be obtained by using the larger heat dissipation plate.

Further, the source terminal (the source electrode) 103s of the MOSFET chip 103 of the U, V, and W-phase rectifiers on the upper side and the drain terminal (the drain electrode) 103d of the MOSFET chip 103 of the U, V, and W-phase rectifiers on the lower side are electrically connected to the terminal of the stator 129 of each phase.

In this way, when the forward side rectifier S1 is used on the upper side and the reverse side rectifier S1 is used on the lower side, the narrow lead electrode 107 of the forward side rectifier S1 and the narrow lead electrode 107 of the reverse side rectifier S2 are disposed to face each other, the lead electrode 107 and the stator 129 of the rectifier are electrically connected with ease.

Further, a gap between the heat dissipation plate 119a on the positive electrode side and the heat dissipation plate 119b on the negative electrode side can be made smaller, and thus the alternator can be miniaturized still more.

The rectifiers S1 and S2 include the base electrode 101 equipped with the circular outer peripheral portion 101s and the lead electrode 107 in the upper portion of the base electrode 101, so that it is possible to use the heat dissipation plates 119a and 119b having a higher versatility.

Hitherto, according to the configuration, the outer appearance of the package of the rectifiers S1 and S2 formed in the base electrode 101 is a circular shape in top view, and the circular package is fixed to the heat dissipation plates 119a and 119b of the electrode plate of the alternator Ot.

With the use of the circular package, the centering can be performed to fix the rectifiers S1 and S2 to the heat dissipation plates 119a and 119b of the electrode plate of the alternator Ot without performing the positional adjustment in a direction around the rotation axis (the center axis O) of the base electrode 101. Therefore, the rectifying apparatus Os of the alternator Ot can be easily assembled.

Accordingly, it is possible to provide the rectifiers S1 and S2 which can be easily fixed to the alternator Ot and includes the MOSFET having low voltage loss and power loss.

In particular, these rectifiers S1 and S2 can be easily fixed to the rectifying apparatus Os (the alternator Ot) by being press-fitted, and the rectifying apparatus Os can be easily assembled.

In this way, the rectifiers S1 and S2 can be easily fixed to the rectifying apparatus Os (the alternator Ot), so that the process of assembling the alternator Ot can be simplified, and the low cost can be achieved.

Further, the description in FIG. 20 has been given focusing on the rectifiers S1 and S2 (130 and 131) and the heat dissipation plates 119a and 119b. The rectifying apparatus Os used as the alternator Ot of the embodiment of the invention is featured in that the rectifiers S1 and S2 of the first and second embodiments are used, and thus the other elements and configurations will be omitted.

<<Other Embodiments>>

Hitherto, the embodiments and the modifications have been described, but the invention is not limited thereto. In addition, the features and the effects have been described, but all the features may be not contained. The effects can be obtained as long as a part of the features are contained.

In the following, the other embodiments and modifications will be described.

<Shape of Base Electrode 101>

The base electrode 101 of the first and second embodiments has been exemplified using a cylindrical outer peripheral portion 101s which has a circular shape in top view, but may have a circular shape in top view while having the curvature in side view. For example, the outer peripheral portion 101s may have a spherical shape.

<Fixing Method of Rectifier S1 Using Solder>

As described above, the description has been given about a case where the rectifier S1 is press-fitted to the heat dissipation plate 119 with reference to FIG. 6, but the fixing method is not limited to the press-fitting. There is also a fixing method using the solder.

In the case of the fixing using the solder, there is no need to form the knurling 101r in the outer peripheral portion 101s of the base electrode 101.

Instead, the solder sheet is disposed in the fitting hole 119h where the heat dissipation plate 119 of the alternator is formed. Then, the base electrode 101 of the rectifier S1 is fitted in the fitting hole 119h of the heat dissipation plate 119, the base electrode 101 of the rectifier S1 is press-fitted to the solder sheet in the fitting hole 119h, and the solder sheet is welded in the soldering furnace, so that the base electrode 101 of the rectifier S1 is fixed in the fitting hole 119h of the heat dissipation plate 119 through the solder.

<Shape of Positioning>

In place of the concave portion 124 illustrated in FIG. 12, the positioning of the rectifiers S1 and S2 may be performed such that the outer peripheral portion 101s of the base electrode 101 or a positioning convex portion is formed in the bottom portion, the concave portion is formed on a set side outside the base electrode 101 to fit in the positioning convex portion, and the positioning convex portion of the base electrode 101 is fitted in the concave portion on the set side.

<Forming Process of Zener Diode>

In the rectifier S1C of the modification of the first embodiment, the description has been given about the process of assembling the zener diode 121 (FIG. 8) as a chip separated from the MOSFET chip 103. However, the manufacturing process is not limited to the following method.

In other words, the zener diode (121) is formed in a process common to the manufacturing process of the MOSFET chip 103, and may be built in the MOSFET chip 103.

The heat generated at the time of surge absorption can be transferred into the MOSFET chip 103 by building the zener diode (121) in the MOSFET chip 103 compared to the case of the separate chip, and the temperature rise of the zener diode (121) can be suppressed.

Therefore, it is possible to realize the same function of surge absorption using a smaller area of the zener diode 121 in top view. In other words, a total chip area of the MOSFET chip 103 and the zener diode 121 in top view can be reduced, and the efficiency of the mounting areas of both chips (121 and 103) can be improved.

<Polarity and Circuit Configuration of MOSFET Chip>

The above embodiment has been described in a case where all the MOSFET chips 103 are realized using an n-channel MOSFET, but may be realized using a p-channel MOSFET.

In a case where the p-channel MOSFET is used, a direction of flowing current in rectification is reversed to that of the n-channel MOSFET, and the rectification current flows from the drain electrode to the source electrode. Therefore, the forward side and the reverse side are in reverse compared to a case where the n-channel MOSFET is used.

In other words, in a case where the p-channel MOSFET is used, the rectifier of the package on the forward side illustrated in FIGS. 1 to 3 is used as the rectifier on the lower side in the rectifying circuit illustrated in FIG. 18.

In addition, the rectifier of the package on the reverse side illustrated in FIGS. 15 to 17 is used as the rectifier on the upper side in the rectifying circuit illustrated in FIG. 18.

When only the rectifier used on the lower side of the rectifying circuit is made using the p-channel MOSFET, the rectifier of the forward side of package illustrated in FIGS. 1 to 3 using the p-channel MOSFET. In addition, the rectifier of the forward side of package illustrated in FIGS. 1 to 3 using the n-channel MOSFET is used on the upper side.

Therefore, the same construction of the forward side of package illustrated in FIGS. 1 to 3 can be used both in the upper side and the lower side, and the development cost of the package, the assembling cost in mass production, and the component cost can be reduced. However, in a case where the p-channel MOSFET is used, there is a need to provide the control circuit chip to control the p-channel MOSFET.

Figure 22:
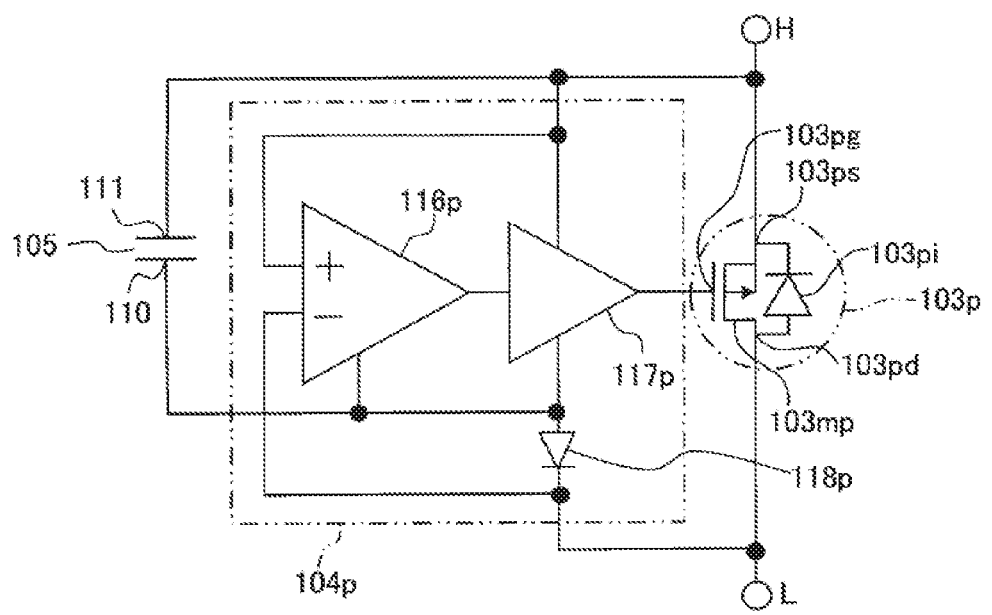
FIG. 22 is a circuit diagram illustrating a circuit configuration of the rectifier in a case where a p-channel MOSFET is used as an embodiment of the invention.

FIG. 22 is a circuit diagram illustrating the circuit configuration of the rectifier in a case where the p-channel MOSFET is used.

In the circuit diagram of FIG. 22, the L terminal is the base electrode 101 and the H terminal is the lead electrode 107 in the forward side of package illustrated in FIGS. 1 to 3, and the L terminal is the lead electrode 107 and the H terminal is the base electrode 101 in the reverse side of package illustrated in FIGS. 15 to 17.

Then, a p-channel MOSFET chip 103p is used in place of the n-channel MOSFET chip 103 illustrated in FIGS. 1 to 3 and FIGS. 15 to 17, and a control circuit chip 104p for the p-channel MOSFET is used in place of the control circuit chip 104 for the n-channel MOSFET.

The p-channel MOSFET chip 103p includes a drain electrode 103pd in the lower surface of the chip and a source electrode 103ps and a gate electrode 103pg in the upper surface of the chip. A diode 103pi is built in parallel with p-channel MOSFET 103mp.

The control circuit chip 104p is configured to include a comparator 116p which compares the voltage at the L terminal with the voltage at the H terminal, a gate driver 117p which applies a voltage to the gate electrode 103g, and a diode 118p for preventing the reverse flow.

Further, the comparator 116p of FIG. 22 is configured such that the polarities of the first input terminal and the second input terminal in the comparator 116 of FIG. 5 are in reverse relation. In other words, the first input terminal of the comparator 116p of FIG. 22 is the non-inverting input terminal, and the second input terminal is the inverting input terminal.

The circuit illustrated in FIG. 22 operates similarly to the rectifier which uses the n-channel MOSFET chip 103. In other words, when the voltage at the H terminal (107) is lower than that at the L terminal (101), the comparator 116p outputs the low voltage signal to the gate driver 117p.

The gate driver 117p to which the low voltage signal is input lowers the voltage of the gate electrode 103pg of the p-channel MOSFET chip 103p to make the p-channel MOSFET chip 103p enter the ON state.

On the contrary, when the voltage at the H terminal is higher than that at the L terminal, the comparator 116p outputs the high voltage signal to the gate driver 117p. The gate driver 117p to which the high voltage signal is input raises the voltage of the gate electrode 103pg of the p-channel MOSFET chip 103p to make the p-channel MOSFET chip 103p enter the OFF state.

Similarly to the rectifier which uses the n-channel MOSFET chip 103, the circuit illustrated in FIG. 22 may use a differential amplifier in place of the comparator 116 to detect and amplify a difference of the input signals, or may turn on/off the p-channel MOSFET chip 103p to control the direction of the current flowing therein.

<Modification of Second Embodiment>

The rectifier S2 of the second embodiment having the configuration of the reverse side has been described mainly focusing on the configuration and the structure of the reverse side using FIGS. 15 to 17. On the other hand, the rectifier S1 of the first embodiment has been described using the rectifiers S1B to S1H as the modifications.

The methods of "including the zener diode (S1C)", "providing the notch (S1D)", "providing the flat (S1E)", "providing the concave portion (S1F)", "using the copper plate or the copper wire (S1G)", and "using the pin with a spring of the copper pin (S1H)" described as the modifications of the first embodiment may be applied as modifications of the rectifier S2 of the second embodiment.

Further, the detailed descriptions in a case where the rectifier S2 of the second embodiment is applied as a modification are overlapped with those of the modifications of the rectifier S1 of the first embodiment, and thus will be omitted.

<Other Power Conversion Devices>

The description in the third embodiment has been given about an example in a case where the rectifiers S1 and S2 and the rectifying apparatus Os are used in the alternator Ot, and may be applied to other power conversion devices.

In particular, in a case where the embodiments of the invention using the MOSFET chip as the rectifier is use in the power conversion device using the diode as the rectifier in the related art, the above effects may be expected even with respect to the power conversion device which includes the rectifier other than the alternator.

For example, even in a case where other power conversion devices such as a variable-frequency AC power conversion device which includes a converter and an inverter is used, the same effects as those described above may be obtained as long as the rectifier of this embodiment is used.
(Supplement of this Embodiment)

The rectifiers (semiconductor elements) S1 and S2 of this embodiment use the MOSFET. As described above, the rectifier mainly used in the related art is the diode. In the following, a difference in the electrical characteristics between the case of using the MOSFET and the case of using the diode will be supplemented.

<Comparison Between MOSFET Characteristic and Diode Characteristic>

Figure 21:
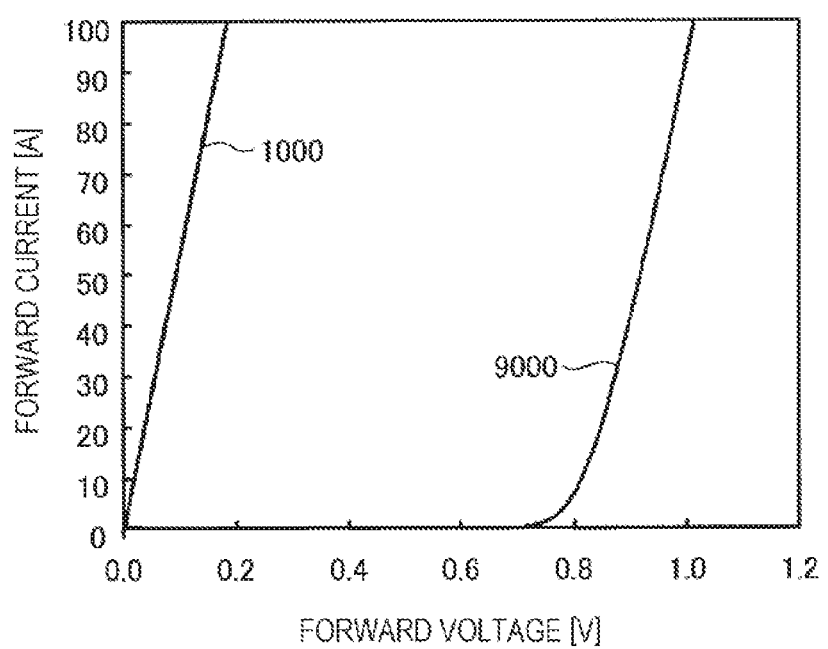
FIG. 21 is a diagram illustrating current/voltage characteristics in a forward direction in comparison between a diode which is a typical rectifier of the related art and a MOSFET which is the rectifier of this embodiment.

FIG. 21 is a diagram illustrating the comparison between the current/voltage characteristics in the forward direction in comparison between the diode which is the rectifier mainly used in the related art and the MOSFET which is the rectifier of this embodiment. Further, the voltage/current characteristics are measured at a room temperature.

In FIG. 21, the horizontal axis is a forward voltage [V] to be applied to the rectifier, and the vertical axis is a forward current [A] to flow to the rectifier.

A characteristic line 9000 is a forward characteristic of the PN-junction diode which is the rectifier in the related art.

A characteristic line 1000 is a forward characteristic when the rectifiers S1 and S2 of the MOSFET which are the rectifiers of this embodiment.

The voltage/current characteristic (the characteristic line 9000) of the diode indicates that the forward current starts to flow when a voltage of 0.7 to 0.8 V is applied. This is because the diode includes a built-in potential (a difference in work function between a P-type semiconductor and an N-type semiconductor in a PN junction), and the forward current can be made flow by applying a voltage exceeding the corresponding voltage to the built-in potential.

In addition, even in a case where the forward current flows, a forward voltage drop corresponding to the built-in potential is present in the rectifier of the diode, and the voltage loss and the power loss occur.

With this regard, in the voltage/current characteristics of the rectifiers S1 and S2 of the MOSFET of the first and second embodiments (the invention), the current starts to flow after the potential difference between the source electrode and the drain electrode exceeds 0 V as long as the potential of the gate electrode of the MOSFET becomes a potential enough to form a channel.

This is because, in a case where a channel is formed between the source electrode and the drain electrode of the MOSFET, the channel between the source electrode and the drain electrode (between source-drain) shows the same type of semiconductor characteristic, and the PN junction such as a diode element is not present in the current path.

Therefore, the rectifiers S1 and S2 of the MOSFET shows no built-in potential as the characteristic line 1000 or an extremely less (the built-in potential caused by a difference in concentration of the carrier) forward characteristic, a large amount of current can flow by a low voltage, and the voltage loss and the power loss at the time of rectification operation can be significantly reduced.

REFERENCE SIGNS LIST

101 base electrode (first external electrode)
101s outer peripheral portion
101r knurling
102 pedestal (part of first external electrode)
103, 103p MOSFET chip
103d, 103pd drain electrode
103g, 103pg gate electrode (gate)
103i, 103ip parasitic diode
103mn n-type MOSFET
103mp p-type MOSFET
103s, 103ps source electrode
104, 104p control circuit chip (control circuit)
104a first electrode (electrode)
104b second electrode (electrode)
104c third electrode (electrode)
104d fourth electrode (electrode)
105 capacitor
106 isolation substrate
107 lead electrode (second external electrode)
107d pedestal (part of second external electrode)
107t lead terminal (external terminal, and part of second external electrode)
108 resin (first resin)
109 solder
110 high voltage side terminal (high voltage side terminal of capacitor)
111 low voltage side terminal (low voltage side terminal of capacitor)
112a, 112b, 112c electrode
113 JCR (second resin)
114 electrode in rear surface of isolation substrate
115 wire
116, 116p comparator
117, 117p gate driver
118, 118p diode for preventing reverse flow
119, 119a, 119b heat dissipation plate
121 zener diode (chip of zener diode)
122 notch (concave portion)
123 orientation flat (concave portion)
124 concave portion
125 copper wire or copper plate (conductor)
126 solder ball, solder bump
127 electrode block
130, 131 rectifier
132 battery
146A, 146B pin with spring (conductive mechanism)
146a1, 146a2 terminal
146b1, 146b2 spring
146c1, 146c2 fixing portion
147a copper bar
O center axis (center line of outer peripheral portion)
Os rectifying apparatus
Ot alternator (power conversion device)
S1, S1A, S1B, S1C, S1D, S1E, S1F, S1G, S1H forward side rectifier, rectifier, semiconductor device
S2 reverse side rectifier, rectifier, semiconductor device

The invention claimed is:

1. A semiconductor device, comprising:
a first external electrode that includes a circular outer peripheral portion in one surface;
a MOSFET chip that includes a drain electrode, a source electrode, and a gate electrode;
a control circuit chip that receives voltages or currents of the drain electrode and the source electrode of the MOSFET chip, and supplies a signal to the gate electrode of the MOSFET chip to control the MOSFET chip on the basis of the voltages or the currents;
a second external electrode that is disposed on an opposite side of the first external electrode with respect to the MOSFET chip, and includes an external terminal on a center axis of the circular outer peripheral portion of the first external electrode; and an isolation substrate that electrically isolates the control circuit chip from the first external electrode or the second external electrode, wherein the first external electrode, the drain electrode and the source electrode of the MOSFET chip, and the second external electrode are disposed to be overlapped in a direction of the center axis, wherein one of the drain electrode and the source electrode of the MOSFET chip is electrically connected to the first external electrode, and wherein the other one of the drain electrode and the source electrode of the MOSFET chip is electrically connected to the second external electrode.

2. The semiconductor device according to claim 1, further comprising:

a capacitor that is connected between a power source terminal of the control circuit chip and a source electrode of the MOSFET chip, wherein the MOSFET chip and the isolation substrate are disposed on the first external electrode or on the second external electrode, and wherein the control circuit and the capacitor are disposed on the isolation substrate.

3. The semiconductor device according to claim 2, further comprising:

a zener diode, wherein a first main terminal of the zener diode and the first external electrode are electrically connected, and wherein a second main terminal of the zener diode and the second external electrode are electrically connected.

4. The semiconductor device according to claim 3, wherein the zener diode is built in the MOSFET chip.

5. The semiconductor device according to claim 2, wherein a shape of the MOSFET chip is a rectangle, and the capacitor and the control circuit chip are disposed at positions near a long side of the rectangle.

6. The semiconductor device according to claim 1, wherein a concave portion or a convex portion for positioning around the center axis of the circular outer peripheral portion is provided in the circular outer peripheral portion or a bottom portion of the first external electrode.

7. The semiconductor device according to claim 2, wherein a concave portion or a convex portion for positioning around the center axis of the circular outer peripheral portion is provided in the circular outer peripheral portion or a bottom portion of the first external electrode.

8. The semiconductor device according to claim 1, wherein one of the drain electrode and the source electrode of the MOSFET chip and the first external electrode, and the other one of the drain electrode and the source electrode of the MOSFET chip and the second external electrode are electrically connected through a solder or by press-fitting.

9. The semiconductor device according to claim 2, wherein one of the drain electrode and the source electrode of the MOSFET chip and the first external electrode, and the other one of the drain electrode and the source electrode of the MOSFET chip and the second external electrode are electrically connected through a solder or by press-fitting.

10. The semiconductor device according to claim 2, wherein the MOSFET chip and the control circuit chip, and the control circuit chip and the capacitor are electrically connected by a wire.

11. The semiconductor device according to claim 2, wherein the MOSFET chip and the control circuit chip, and the control circuit chip and the capacitor each are electrically connected between electrodes thereof by a conductive mechanism that includes a conductor and a spring, and wherein the conductor is fixed to the electrode through a solder, and the conductive mechanism is pressed by an elastic force of the spring and fixed to the electrode.

12. The semiconductor device according to claim 2, wherein the first external electrode includes a pedestal having a size to be contained in the circular outer peripheral portion, wherein the MOSFET chip and the isolation substrate in which the control circuit chip and the capacitor are built are built on the pedestal, and wherein the pedestal, the MOSFET chip, the control circuit chip, the capacitor, and the isolation substrate are covered by a first resin.

13. The semiconductor device according to claim 12, wherein side walls of the MOSFET chip and the control circuit chip are covered by a second resin in the first resin, and wherein the second resin has a higher adhesion between the MOSFET chip and the control circuit chip than the first resin.

14. The semiconductor device according to claim 1, wherein the MOSFET chip includes an n-type MOSFET.

15. An alternator, comprising:
the semiconductor device according to claim 1.

16. An alternator, comprising:
a rectifying circuit that includes
a rectifying apparatus on an upper side, in which the drain electrode of the MOSFET chip according to claim 1 is electrically connected to the first external electrode, and the source electrode of the MOSFET chip is electrically connected to the second external electrode, and
a rectifying apparatus on the lower side, in which the source electrode of the MOSFET chip is electrically connected to the first external electrode, and the drain electrode of the MOSFET chip is electrically connected to the second external electrode.

17. A power conversion device, comprising:
the semiconductor device according to claim 1.

* * * * *